(12) United States Patent
Kubota

(10) Patent No.: US 9,439,291 B2
(45) Date of Patent: Sep. 6, 2016

(54) PHOTOSENSITIVE ELEMENT, METHOD FOR FORMING RESIST PATTERN, AND METHOD FOR PRODUCING PRINTED CIRCUIT BOARD

(75) Inventor: Masao Kubota, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 13/994,971

(22) PCT Filed: Dec. 15, 2011

(86) PCT No.: PCT/JP2011/079097
§ 371 (c)(1),
(2), (4) Date: Jun. 17, 2013

(87) PCT Pub. No.: WO2012/081680
PCT Pub. Date: Jun. 21, 2012

(65) Prior Publication Data
US 2013/0266900 A1    Oct. 10, 2013

(30) Foreign Application Priority Data
Dec. 16, 2010 (JP) .............................. P2010-280604

(51) Int. Cl.
| G03F 7/40 | (2006.01) |
|---|---|
| G03F 7/16 | (2006.01) |
| G03F 7/09 | (2006.01) |
| H05K 3/06 | (2006.01) |
| H05K 3/00 | (2006.01) |
| G03F 7/031 | (2006.01) |
| G03F 7/085 | (2006.01) |
| G03F 7/033 | (2006.01) |
| G03F 7/20 | (2006.01) |

(52) U.S. Cl.
CPC .............. *H05K 3/064* (2013.01); *G03F 7/031* (2013.01); *G03F 7/033* (2013.01); *G03F 7/085* (2013.01); *G03F 7/09* (2013.01); *G03F 7/20* (2013.01); *G03F 7/40* (2013.01); *H05K 3/0076* (2013.01)

(58) Field of Classification Search
None
See application file for complete search history.

(56) References Cited

U.S. PATENT DOCUMENTS

| 3,884,693 | A | | 5/1975 | Bauer et al. |
|---|---|---|---|---|
| 4,318,975 | A | | 3/1982 | Kuznetsov et al. |
| 5,648,159 | A | * | 7/1997 | Sato .............. 428/327 |
| 5,922,509 | A | * | 7/1999 | Kautz et al. ......... 430/281.1 |
| 7,588,835 | B2 | * | 9/2009 | Yamashita ............ C23C 8/02 148/277 |
| 2004/0063025 | A1 | | 4/2004 | Natori et al. |
| 2006/0163559 | A1 | * | 7/2006 | Koganei ........... H01L 51/0021 257/40 |
| 2010/0112481 | A1 | | 5/2010 | Kubota et al. |
| 2010/0279229 | A1 | | 11/2010 | Miyasaka et al. |
| 2010/0285408 | A1 | | 11/2010 | Miyasaka et al. |

FOREIGN PATENT DOCUMENTS

| CN | 1358281 A | 7/2002 |
|---|---|---|
| CN | 101180578 A | 5/2008 |
| CN | 101600995 A | 12/2009 |
| EP | 1 205 802 A1 * | 5/2002 |
| JP | 47-000469 A | 1/1972 |
| JP | 55-501072 A | 12/1980 |
| JP | 56-040824 B2 | 9/1981 |
| JP | 59-097138 A | 6/1984 |
| JP | 59-216141 A | 12/1984 |
| JP | 63-197942 A | 8/1988 |
| JP | 01-221735 A | 9/1989 |
| JP | 02-230149 A | 9/1990 |
| JP | 07-333853 A | 12/1995 |
| JP | 2757528 B2 | 5/1998 |
| JP | 2931693 B2 | 8/1999 |
| JP | 11-327137 A | 11/1999 |
| JP | 2972373 B2 | 11/1999 |
| JP | 3215718 B2 | 10/2001 |
| JP | 3312756 B2 | 8/2002 |
| JP | 2003-098663 A | 4/2003 |
| JP | 2007-102184 A | 4/2007 |
| JP | 2007-279381 A | 10/2007 |
| JP | 2010-217399 A | 9/2010 |
| KR | 1020090091323 A | 8/2009 |
| TW | 201017330 A | 5/2010 |
| WO | 00/79344 A1 | 12/2000 |
| WO | 02/27407 A1 | 4/2002 |

(Continued)

OTHER PUBLICATIONS

English translation of WO 2010/13623 a obtained from http://patentscope.wipo.int/search/en/detail.jsf on Mar. 15, 2014 26 pages.*

(Continued)

*Primary Examiner* — Cynthia Hamilton
(74) *Attorney, Agent, or Firm* — Griffin and Szipl PC

(57) ABSTRACT

The invention relates to a photosensitive element comprising a support film and a photosensitive layer derived from a photosensitive resin composition formed on the support film, wherein the support film haze is 0.01-1.5%, the total number of particles with diameters of 5 μm and larger and aggregates with diameters of 5 μm or larger in the support film is no greater than 5/mm², the photosensitive layer contains a binder polymer, a photopolymerizable compound with an ethylenically unsaturated bond and a photopolymerization initiator, and the thickness T of the photosensitive layer and the absorbance A of the photosensitive layer at 365 nm satisfies the relationship represented by inequality (I):

$$0.001 \leq A/T \leq 0.020 \qquad (I).$$

8 Claims, 3 Drawing Sheets

(56) References Cited

FOREIGN PATENT DOCUMENTS

| WO | 2008/093643 A1 | 8/2008 |
|---|---|---|
| WO | 2010/013623 A1 | 2/2010 |
| WO | 2010/098183 A1 | 9/2010 |
| WO | WO-2012005722 A1 * | 1/2012 |

OTHER PUBLICATIONS

English translation of JP,2010-217399, A (2010) from machine translation from AIPN Japan Patent Office National Center for Industrial Property Information and Training, generated Mar. 15, 31 pages.*

English translation of JP, 2003-098663, A (2003) from machine translation from AIPN Japan Patent Office National Center for Industrial Property Information and Training, generated Mar. 15, 15 pages.*

English translation of JP, 2007-102184, A (2007) from machine translation from AIPN Japan Patent Office National Center for Industrial Property Information and Training, generated Mar. 15, 27 pages.*

English translation of International Preliminary Report on Patentability completed Jun. 18, 2013 and mailed Jun. 27, 2011, from PCT/JP2011/079097.

International Search Report issued in corresponding application No. PCT/JP2011/079097, completed Jan. 5, 2012 and mailed Jan. 17, 2012.

Notice of Allowance mailed Jul. 15, 2014 for corresponding Korean Patent Application No. 10-2013-7011343.

Office Action issued in counterpart Chinese application 201180006031.5 on Nov. 24, 2014 (no translation available; submitted for certification).

Office Action issued in corresponding Taiwanese application 100146843 on Jun. 25, 2015 (no translation available; submitted for certification).

* cited by examiner

PHOTOSENSITIVE ELEMENT, METHOD FOR FORMING RESIST PATTERN, AND METHOD FOR PRODUCING PRINTED CIRCUIT BOARD

This is a National Phase Application in the United States of International Patent Application No. PCT/JP2011/079097 filed Dec. 15, 2011, which claims priority on Japanese Patent Application No. P2010-280604, filed Dec. 16, 2010.

FIELD OF THE INVENTION

The present invention relates to a photosensitive element, and to a method for forming a resist pattern and a method for producing a printed wiring board, which employ it.

BACKGROUND OF THE INVENTION

The fields of manufacturing conventional printed wiring boards and precision working of metals widely employ photosensitive elements comprising a layer made of a photosensitive resin composition ("photosensitive layer"), a support film and a protective film, as resist materials for etching, plating and the like.

A printed wiring board may be manufactured, for example, in the following manner. First, the protective film of a photosensitive element is released from the photosensitive layer and the photosensitive layer is then laminated on the conductive film of a circuit-forming board. After subsequent pattern exposure of the photosensitive layer, the unexposed sections are removed with a developing solution to form a resist pattern. The conductive film is patterned based on this resist pattern to form the printed wiring board.

The developing solution used for removal of the unexposed sections is usually an alkali developing solution such as a sodium carbonate solution. For most purposes, the developing solution may be any one capable of dissolving the photosensitive layer to some extent, as the photosensitive layer becomes dissolved in the developing solution or dispersed in the developing solution during development.

With increasingly higher densities of printed wiring boards in recent years, the contact areas between circuit-forming boards and the photosensitive layers that are used as resist materials have been decreasing in size. The photosensitive layer must therefore have excellent mechanical strength, chemical resistance and flexibility in the etching or plating step, while also having excellent adhesiveness for circuit-forming boards and high resolution for pattern formation. In recent years, materials that can form resist patterns with line widths and space widths that are both 10 μm or smaller are in demand, particularly for use in package boards, and it is becoming necessary for resist pattern shapes to be nearly rectangular in order to increase the interconnect insulating reliability.

When a photosensitive element is used to form a resist, usually the photosensitive layer is laminated on the board and exposed without peeling off the support film. An optically transparent material may be employed as the support film to facilitate exposure treatment. The support film must also be as thin as possible in order to obtain high resolution for pattern formation. On the other hand, a certain minimum level of thickness (generally 10 μm-30 μm) is required for the support film in order to allow coating of the photosensitive resin composition on the support film to a uniform thickness with satisfactory yield. For increased productivity of the support film, i.e. to improve the take-up properties of the support film, inorganic or organic fine particles are usually added to the support film. Conventional support films therefore have increased haze, and the fine particles in the support film tend to cause light scattering under light exposure, so that the requirement for high resolution of the photosensitive film cannot be met.

Methods for achieving high resolution include a method wherein a support film provided on a photosensitive element is peeled off before exposure so that exposure is accomplished without the support film. In this case, a phototool is often bonded directly onto the photosensitive layer. However, since the photosensitive layer usually has some level of pressure-sensitive adhesive property, it is difficult to remove the bonded phototool when exposure is carried out after directly bonding a phototool onto the photosensitive layer. In addition, the photosensitivity tends to be reduced by contamination of the phototool by the photosensitive layer, or exposure of the photosensitive layer to oxygen in the air when the support film is removed.

Various means have been proposed as improvements in this regard. For example, Patent Literatures 1 and 2 disclose methods in which two or more photosensitive layers are formed, the layer directly bonded to the phototool being one without an adhesive property. Also, Patent Literatures 3 to 8 propose methods in which an interlayer is provided between the support film and photosensitive layer. In Patent Literatures 9 and 10 there are proposed methods in which inorganic or organic fine particles with a mean particle size of about 0.01 to 5 μm are added to the outer surface on one side of the support film to lower the haze, thus allowing high resolution even with exposure through a support film.

CITATION LIST

Patent Literature

Patent Literature 1: JP 01-221735 A
Patent Literature 2: JP 02-230149 A
Patent Literature 3: JP 56-040824 B
Patent Literature 4: JP 55-501072 A
Patent Literature 5: JP 47-000469 A
Patent Literature 6: JP 59-097138 A
Patent Literature 7: JP 59-216141 A
Patent Literature 8: JP 63-197942 A
Patent Literature 9: JP 07-333853 A
Patent Literature 10: WO 00/079344 A

SUMMARY OF THE INVENTION

Technical Problem

The methods described in Patent Literatures 1 to 8, however, require extra coating steps for formation of the interlayer or formation of multiple photosensitive layers, and this increases the number of manufacturing steps. Also, since the photosensitive layer is exposed to oxygen in the air when it is set on the substrate, it is difficult to maintain high photosensitivity by the methods described in Patent Literatures 1 and 2. Furthermore, since the interlayer is thin when using the methods described in Patent Literatures 3 to 8, the photosensitive element is not easy to handle.

Results of investigation by the present inventors have also shown that, despite the increased high resolution when using the methods described in Patent Literatures 9 and 10, defects are formed in the resist pattern and the production yield for printed wiring boards tends to be reduced, as the film thickness of the photosensitive layer is decreased.

On the other hand, as the density of a printed wiring board is increased, especially when using a photosensitive element in a semi-additive process, the surface roughness (Ra) of the substrate with which the photosensitive layer contacts is smooth, at less than 300 nm, and this tends to lower the adhesiveness and decrease production yields for printed wiring boards.

Moreover, as the printed wiring board density increases, especially when using a photosensitive element in a tenting process, the etching factor is increased, which tends to reduce the film thickness of the photosensitive layer, but the resist ruptures at the through-hole sections, often lowering the printed wiring board production yield.

Recently there is a trend toward using projection exposure systems to increase positioning precision. The exposure illuminance of a projection exposure system is higher than a conventionally employed contact exposure device, and the exposure time is therefore shorter. The photocuring reaction therefore fails to proceed sufficiently at the bottom parts of the resist, and this tends to result in lower adhesiveness and reduced production yield.

The present invention has been accomplished in light of these circumstances, and its object is to provide a photosensitive element comprising a layer made of a photosensitive resin composition, the photosensitive element allowing formation of a resist pattern with satisfactory adhesiveness and resolution, with sufficiently reduced microdefects of the resist, and with a more nearly rectangular cross-sectional shape, even for substrates with a substrate surface roughness (Ra) of less than 300 nm, as well as a method for forming a resist pattern using the same.

Solution to Problem

The invention provides a photosensitive element comprising a support film and a photosensitive layer derived from a photosensitive resin composition formed on the support film, wherein the support film haze is 0.01-1.5%, the total number of particles with diameters of 5 μm and larger and aggregates with diameters of 5 μm or larger in the support film is no greater than 5/mm², the photosensitive layer contains a binder polymer, a photopolymerizable compound with an ethylenically unsaturated bond and a photopolymerization initiator, and the thickness T of the photosensitive layer and the absorbance A of the layer comprising the photosensitive resin composition at 365 nm satisfies the relationship represented by the following inequality (I).

$$0.001 \leq A/T \leq 0.020 \quad (I)$$

When a conventional photosensitive element is used to form a resist pattern, the high absorbance of the photosensitive layer tends to result in extremely inverted trapezoid shapes for the cross-sections of resist patterns with line widths of 10 μm and smaller. As a result, the cross-sections of wiring patterns formed using such resist patterns have extremely inverted trapezoid shapes, which has imposed a limit on density increase for printed wiring boards.

First, the present inventors focused on the support film and found that by employing a support film with sufficiently reduced haze and with a sufficiently low total number of particles with diameters of 5 μm and larger and aggregates with diameters of 5 μm or larger in the film, it is possible to minimize light scattering of the active light rays irradiated during exposure and to reduce loss of the resist pattern following development. Next, the present inventors studied the relationship between absorbance at 365 nm and film thickness of the photosensitive layer, and as a result found it is possible to achieve a nearly rectangular cross-sectional shape for a resist pattern, and that sufficient adhesiveness can be obtained even when using a substrate with a substrate surface roughness (Ra) of less than 300 nm, whereupon the present invention was completed.

Furthermore, if the photopolymerization initiator in the photosensitive element of the invention contains a 2,4,5-triarylimidazole dimer, it is possible to further increase the adhesiveness and resolution while maintaining high photosensitivity, and to form an extra fine resist pattern.

The photopolymerization initiator preferably contains a pyrazoline compound represented by the following general formula (XI) or (XII).

[Chemical Formula 1]

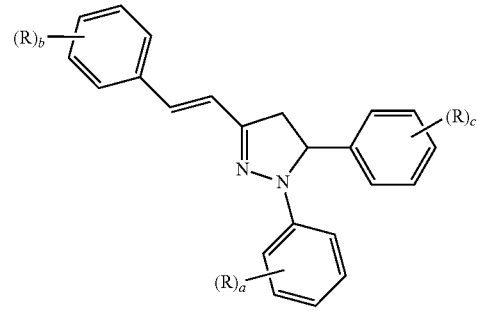

(XI)

[Chemical Formula 2]

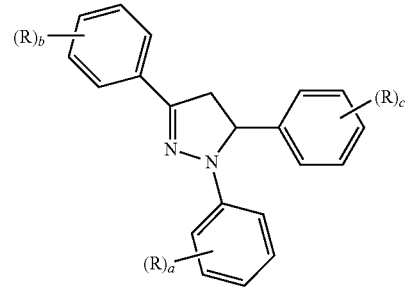

(XII)

R each independently represents a C1-12 straight-chain or branched alkyl group, a C1-10 straight-chain or branched alkoxy group or a halogen atom, a, b and c each independently represent an integer of 0 to 5, the total of a, b and c being between 1 and 6, and when the total of a, b and c is 2 or greater the multiple R groups may be the same or different.

By adding the aforementioned pyrazoline compound as a photopolymerization initiator, it is possible to further increase the photosensitivity while maintaining the absorbance of the photosensitive layer within a constant range, thus allowing productivity for printed wiring boards to be improved.

From the viewpoint of solubility in solvents, preferably at least one R in formula (XI) and (XII) is an isopropyl, methoxy or ethoxy group.

If the photopolymerizable compound in the photosensitive element of the invention contains a compound represented by the following general formula (II), the balance between adhesiveness, resolution and chemical resistance will be satisfactory and it will be possible to form an extra fine resist pattern.

[Chemical Formula 3]

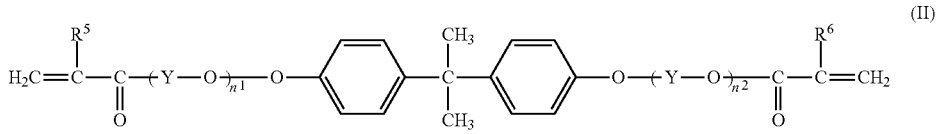
(II)

In the formula, $R^5$ and $R^6$ each independently represent hydrogen or a methyl group, Y represents a C2-6 alkylene group, $n^1$ and $n^2$ each independently represent a positive integer, $n^1+n^2$ is 4-40, and when $n^1+n^2$ is 4 or greater the multiple Y groups may be the same or different.

When the binder polymer in the photosensitive element of the invention has a divalent group represented by the following general formula (III), (IV) and (V), the balance between adhesiveness, resolution and release property will be more satisfactory and it will be possible to form an extra fine resist pattern.

[Chemical Formula 4]

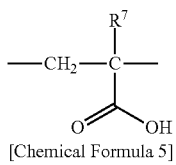
(III)

[Chemical Formula 5]

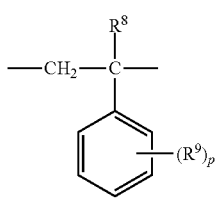
(IV)

[Chemical Formula 6]

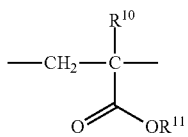
(V)

In the formulas, $R^7$, $R^8$ and $R^{10}$ each independently represent hydrogen or a methyl group, $R^9$ represents a C1-4 alkyl group, a C1-3 alkoxy group, a hydroxyl group or a halogen atom, $R^{11}$ represents a C1-6 alkyl group, p represents an integer of 0-5, and when p is 2 or greater the multiple $R^9$ groups may be the same or different.

If the binder polymer further has a divalent group represented by the following general formula (VI) together with a divalent group represented by the general formula (III), (IV) and (V), it will be possible to further improve the balance between adhesiveness, resolution and release property.

[Chemical Formula 7]

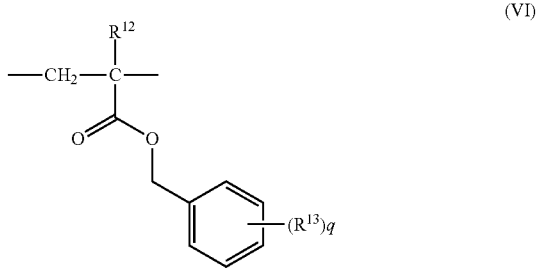
(VI)

In the formula, $R^{12}$ represents hydrogen or a methyl group, and $R^{13}$ represents a C1-4 alkyl group, a C1-3 alkoxy group, a hydroxyl group or a halogen atom. The letter q represents an integer of 0-5, and when q is 2 or greater, the multiple $R^{13}$ groups may be the same or different.

The invention further provides a method for forming a resist pattern, comprising a lamination step in which the photosensitive element is laminated on a circuit-forming board in the order of the photosensitive layer first followed by the support film, an exposure step in which prescribed sections of the photosensitive layer are irradiated with active light rays through the support film to form photocured sections on the photosensitive layer, and a developing step in which the non-photocured sections of the photosensitive layer are removed.

Since a photosensitive element of the invention is used in the method for forming a resist pattern of the invention, it is possible to efficiently obtain an extra fine resist pattern.

The invention still further provides a method for producing a printed wiring board, wherein a circuit-forming board on which a resist pattern has been formed is subjected to etching or plating. Since the method for forming a resist pattern employing a photosensitive element of the invention is used in the method for producing a printed wiring board according to the invention, a high density printed wiring board with an extra fine wiring pattern can be obtained.

Advantageous Effects of Invention

According to the invention it is possible to provide a photosensitive element comprising a layer made of a photosensitive resin composition, the photosensitive element allowing formation of a resist pattern with satisfactory adhesiveness and resolution, with sufficiently reduced microdefects of the resist, and with a more nearly rectangular cross-sectional shape, even for substrates with a substrate surface roughness (Ra) of less than 300 nm, as well as a method for forming a resist pattern using the same.

DETAILED DESCRIPTION OF THE INVENTION

Description of Embodiments

Figure 1:
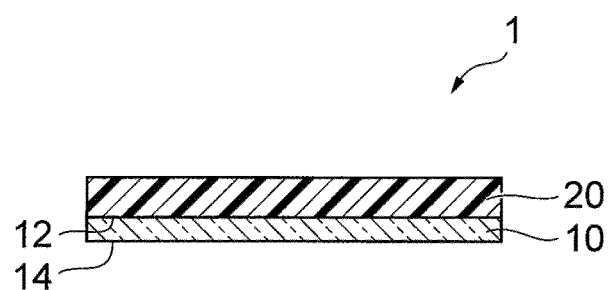
FIG. 1 is a schematic cross-sectional view showing a preferred embodiment of a photosensitive element of the invention.

Preferred embodiments of the invention will now be explained in detail, with reference to the accompanying drawings as necessary. Throughout the drawings, corresponding elements will be referred to by like reference numerals and will be explained only once. Unless otherwise specified, the vertical and horizontal positional relationships are based on the positional relationships in the drawings. Also, the dimensional proportions depicted in the drawings are not necessarily limitative. The term "(meth)acrylate" used throughout the present specification refers to the "acrylate" and its corresponding "methacrylate". Similarly, the term "(meth)acrylic" refers to "acrylic" and its corresponding "methacrylic" compound, and "(meth)acryloyl" refers to "acryloyl" and its corresponding "methacryloyl" compound.

FIG. 1 is a schematic cross-sectional view showing a preferred embodiment of a photosensitive element of the invention. The photosensitive element 1 shown in FIG. 1 has a construction with a support film 10 and a photosensitive layer 20. The photosensitive layer 20 is formed on the first main side 12 of the support film 10. The support film 10 has a second main side 14 opposite the first main side 12.

(Support Film)

The support film 10 has a haze of 0.01-1.5%, and a total number of particles and aggregates with diameters of 5 μm and larger in the support film 10 (hereinafter collectively referred to simply as "particles") of no greater than 5/mm². The particles with diameters of 5 μm and larger in the support film 10 include particles that protrude from the main side of the support film, and particles present within the film. The particles with diameters of 5 μm and larger also include primary particles with diameters of 5 μm and greater and aggregates of primary particles with diameters of less than 5 μm.

The haze of the support film 10 is preferably 0.01-1.5%, more preferably 0.01-1.3%, even more preferably 0.01-1.0% and yet more preferably 0.01-0.5%. If the haze is less than 0.01% the support film itself will not be easy to fabricate, and if it is greater than 1.5% the sensitivity and resolution will tend to be reduced. The term "haze" refers to the degree of cloudiness. The haze according to the invention is the value measured using a commercially available cloudiness meter (turbidimeter) according to the method of JIS K 7105. The haze may be measured using a commercially available turbidimeter such as an NDH-1001DP (trade name of Nippon Denshoku Industries Co., Ltd.).

The particles with diameters of 5 μm and larger are preferably present at no greater than 5/mm², more preferably no greater than 3/mm² and even more preferably no greater than 1/mm². If the number of particles exceeds 5/mm², partial loss of the resist (microdefects in the resist) will tend to occur after light exposure and development. When such a photosensitive element is used in a printed wiring board, it can be a cause of open failures with etching or shorting failures with plating, thus lowering the production yield of the printed wiring board.

However, even a large number of particles with diameters of less than 5 μm in the support film 10 will not significantly affect the light scattering. The reason for this is that upon irradiation of light on the photosensitive layer in the exposure step, the photocuring reaction in the photosensitive layer proceeds not only at the photoirradiated sections but also to some degree in the transverse direction (the direction perpendicular to the photoirradiation direction) where the light has not been directly irradiated. With small particle sizes, therefore, photocuring reaction proceeds satisfactorily directly below the particles, but as the particle sizes increase the photocuring reaction fails to satisfactorily occur directly below the particles, thus resulting in microdefects in the resist.

The particles with diameters of 5 μm and larger in the support film 10 are produced as aggregates of the constituent components of the support film, such as the gelled polymers, the monomer starting materials, the catalyst used for production and the inorganic or organic fine particles included as necessary, the aggregates being formed during fabrication of the film, as well as bulges of the lubricant and adhesive that occur during coating of the lubricant-containing layer on the film, and particles with diameters of 5 μm and larger that are present in the film. Particles with small particle sizes or high dispersibility may be selectively used among such particles, in order to limit the number of particles with diameters of 5 μm and larger to no more than 5/mm².

Figure 2:
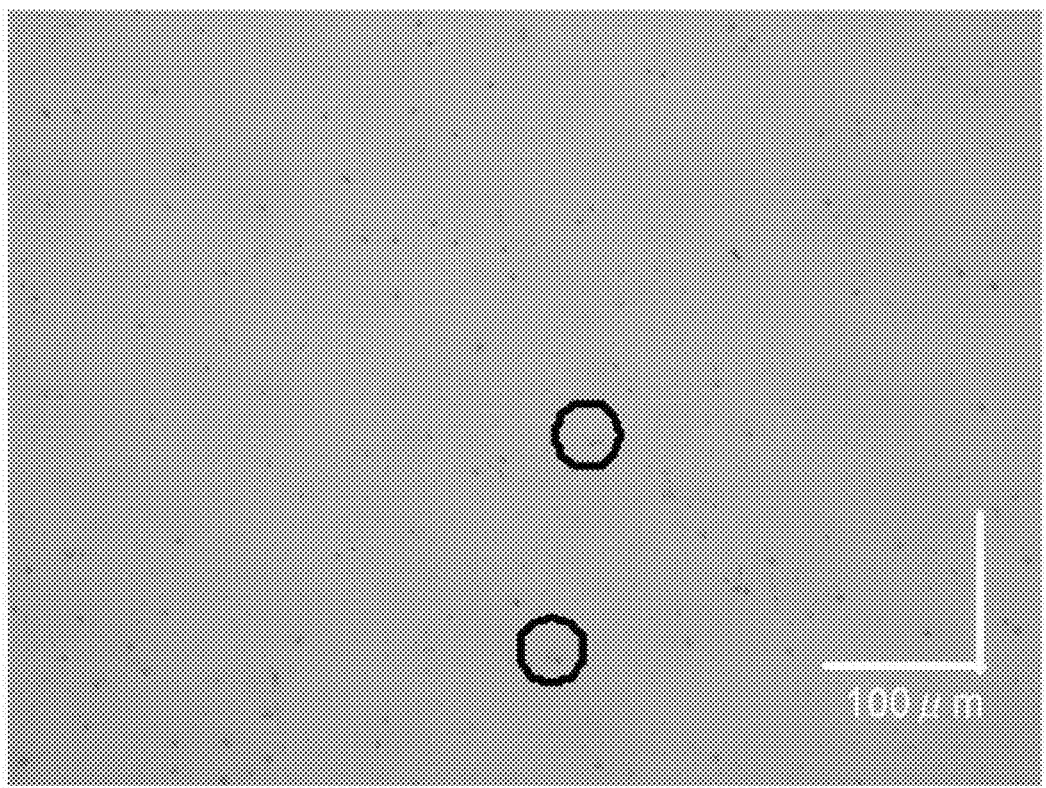
FIG. 2 is a polarizing microscope photograph of the surface of a support film containing particles with diameters of 5 μm and larger.
Figure 3:
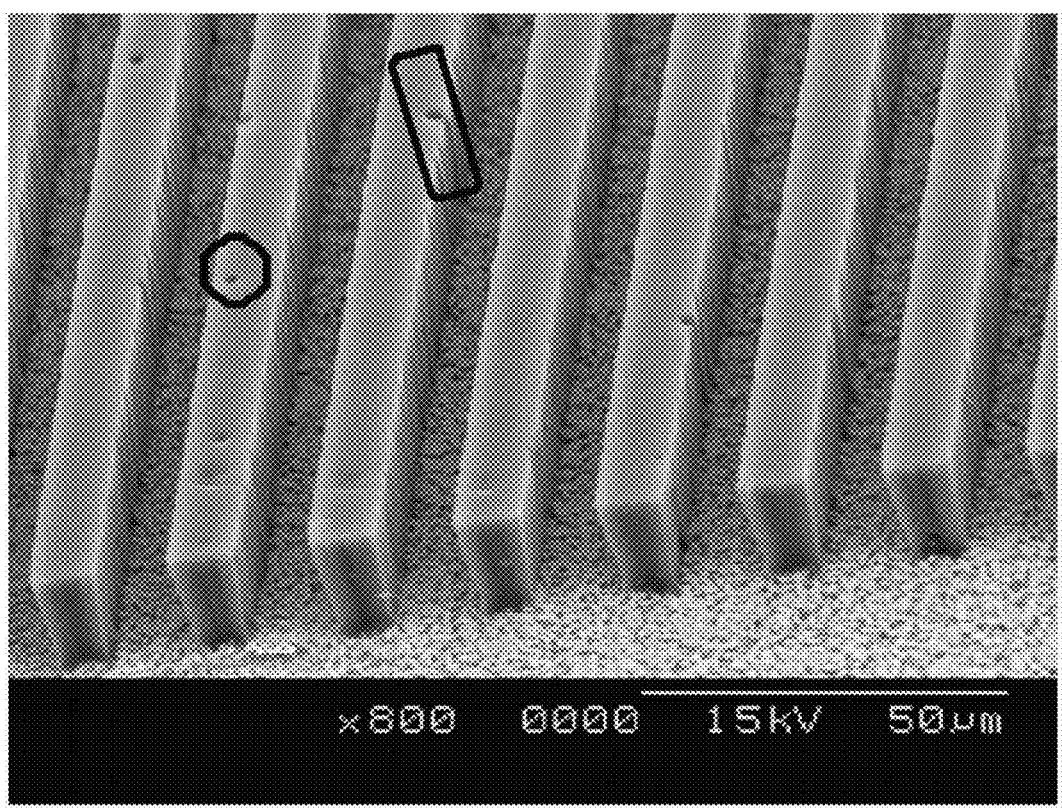
FIG. 3 is a scanning photomicrograph of a resist pattern formed using a photosensitive element comprising a photosensitive layer on a support film with numerous particles with diameters of 5 μm and larger.

The number of particles with diameters of 5 μm and larger may be measured using a polarizing microscope. An aggregate formed by aggregation of a primary particle with a diameter of 5 μm or larger and a primary particle with a diameter of less than 5 μm is counted as one. FIG. 2 is a polarizing microscope photograph of the surface of a support film containing particles with diameters of 5 μm and larger. In FIG. 2, the circled regions are examples of sections corresponding to particles with diameters of 5 μm and larger. FIG. 3 is a scanning photomicrograph of a resist pattern formed using a photosensitive element comprising a photosensitive layer on a support film with numerous particles with diameters of 5 μm and larger. When numerous particles with diameters of 5 μm and larger are present on the surface of the support film as shown here, loss of the resist occurs.

The material of the support film 10 is not particularly restricted so long as the total number of particles with diameters of 5 μm and larger is no greater than 5/mm². The support film 10 may be, for example, a film containing one or more resin materials selected from the group consisting of polyesters such as polyethylene terephthalate (hereinafter abbreviated as "PET") and polyolefins such as polypropylene and polyethylene.

The support film 10 may be either a monolayer or a multilayer film. For example, when a two-layer support film comprising two layers is to be used, preferably a two-layer film obtained by laminating a fine particle-containing resin layer on one side of a biaxially oriented polyester film is used as the support film, and a photosensitive layer is formed on the side opposite the side on which the fine particle-containing resin layer has been formed. The support film may also be a multilayer support film composed of three layers (A layer/B layer/A layer, for example). There are no particular restrictions on the construction of the multilayer support film, but from the viewpoint of slidability of the film, the outermost layer (the A layer in the case of the aforementioned three-layer film) is preferably a fine particle-containing resin layer.

Because conventional two-layer support films are produced by coating a biaxially oriented polyester film with a fine particle-containing resin layer, the fine particle-containing resin layer tends to peel during lamination of the photosensitive film, and the peeled resin layer can adhere to the photosensitive resin layer and cause defects. According to the invention, therefore, it is preferable to use a multilayer support film comprising three layers formed by injection molding of a fine particle-containing resin layer and a biaxially oriented polyester film.

Most preferably, according to the invention, the haze of the support film 10 is between 0.01 and 1.5%, and the number of particles with diameters of 5 μm and larger in the support film 10 is adjusted to no more than 5/mm², while the multilayer support film is also provided with such a fine particle-containing resin layer. This will improve the slidability of the film and create a satisfactory balance and higher level property to inhibit light scattering during light exposure. The mean particle size of the fine particles is preferably 0.1-10 times and more preferably 0.2-5 times the layer thickness of the fine particle-containing resin layer. A mean particle size of less than 0.1 times the thickness will tend to result in poor slidability, while an excess of 10 times the thickness will tend to create irregularities in the photosensitive layer.

The fine particles are preferably present at 0.01 to 50 wt % in the fine particle-containing resin layer. As examples for the fine particles, there may be used fine particles and aggregates produced during polymerization by various nucleating agents, inorganic fine particles such as silicon dioxide fine particles (aggregated silica and the like), calcium carbonate fine particles, alumina fine particles, titanium oxide fine particles and barium sulfate fine particles, organic fine particles such as crosslinked polystyrene fine particles, acrylic fine particles and imide fine particles, as well as mixtures of the foregoing.

In a multilayer support film with three or more layers, one or more interlayers sandwiched between fine particle-containing outermost layers may contain or may not contain fine particles, but they preferably do not contain the fine particles from the standpoint of resolution. When an interlayer contains the aforementioned fine particles, the content in the interlayer is preferably no greater than ⅓ and more preferably no greater than ⅕ of the content in the outermost layer.

From the standpoint of resolution, the layer thickness of the fine particle-containing resin layer is preferably 0.01-5 μm, more preferably 0.05-3 μm and most preferably 0.1-2 μm. The side of the outermost layer not facing the interlayer preferably has a static friction coefficient of no greater than 1.2. A static friction coefficient of greater than 1.2 will lead to wrinkles during film formation and photosensitive element fabrication, and the increased static electricity will tend to cause adhesion of dirt. For the purpose of the invention, the static friction coefficient can be measured according to ASTM D1894.

In order to limit the number of particles with diameters of 5 μm and larger in the support film 10 to no more than 5/mm² on one main side, it is preferred for the particle sizes of the fine particles in the fine particle-containing resin layer to be less than 5 μm. Also, in order to further reduce light scattering during exposure, it is preferred to appropriately adjust the layer thickness of the fine particle-containing resin layer according to the particle sizes of the fine particles.

The support film 10 may also contain an antistatic agent or the like if necessary, within a range that does not impair the photosensitive property.

The thickness of the support film 10 is preferably 5-40 μm, more preferably 8-35 μm, even more preferably 10-30 μm and most preferably 12-25 μm. If the thickness is less than 5 μm, the support film 10 will tend to tear when it is released from the photosensitive element 1. If the thickness exceeds 40 μm, the resolution will tend to be reduced and economy may be compromised.

The support film 10 may be procured from among ordinary commercially available industrial films that are suitable for use as support films for the photosensitive element 1, with appropriate processing. An example of an ordinary industrial film suitable for use as the support film 10 is "FB-40" (trade name of Toray Co., Ltd.), a PET film with a three-layer structure containing fine particles in the outermost layer.

(Photosensitive Layer)

The photosensitive layer 20 is a layer formed using a photosensitive resin composition (derived from a photosensitive resin composition). The thickness T of the photosensitive layer and the absorbance A of the photosensitive layer at 365 nm satisfy the relationship represented by the following inequality (I).

$$0.001 \le A/T \le 0.020 \tag{I}$$

The absorbance of the photosensitive layer can be measured using a UV spectrophotometer ("U-3310", trade name of Hitachi, Ltd.). The absorbance may be measured by placing the photosensitive element comprising the support film and photosensitive layer on the measuring end of the apparatus, placing the support film alone on the reference end, and conducting continuous measurement from 550-300 nm in absorbance mode.

The ratio A/T (also referred to hereunder as "Y value"), as the ratio between the absorbance A of the photosensitive layer at 365 nm and the thickness T of the photosensitive layer, is preferably 0.001-0.020, more preferably 0.005-0.020, even more preferably 0.010-0.020, yet more preferably 0.012-0.018 and most preferably 0.014-0.016. With a Y value of less than 0.001 there is virtually no photoabsorption in the photosensitive layer, and therefore the sensitivity tends to be reduced and productivity of the printed wiring board tends to be lowered, while the increased amount of light reflected from the substrate tends to lower the resolution due to a halation effect. On the other hand, a Y value exceeding 0.020 increases the amount of light absorption on the top parts of the exposed sections, resulting in insufficient photocuring reaction at the bottom parts of the exposed sections, tending to result in an inverted trapezoid resist shape after development, reduced adhesiveness, and an impaired tenting property. In addition, when using a projection exposure system which usually produces exposure illuminance of 60 mW/cm² or greater, notable reduction in adhesiveness will be exhibited. When a substrate having a substrate surface roughness (Ra) of less than 300 nm is used, the reduction in adhesiveness becomes even more notable. The substrate surface roughness (Ra) can be measured using a surface roughness measuring instrument ("SE-30D", trade name of Kosaka Laboratory, Ltd.).

The photosensitive resin composition composing the photosensitive layer 20 comprises (a) a binder polymer (hereunder referred to as "component (a)"), (b) a photopolymerizable compound with an ethylenically unsaturated bond (hereunder referred to as "component (b)"), and (c) a photopolymerization initiator (hereunder referred to as "component (c)"). Each of these components will now be explained in detail.

The binder polymer for component (a) is not particularly restricted so long as it is one used in conventional photosensitive resin compositions, and examples include acrylic resins, styrene resins, epoxy resins, amide resins, amide-epoxy resins, alkyd resins and phenol resins. Acrylic resins are preferred from the viewpoint of the alkali developing property. These may be used as single compounds or as combinations of two or more compounds.

The binder polymer may be produced by radical polymerization of a polymerizable monomer. Polymerizable monomers include styrene, polymerizable styrene derivatives such as vinyltoluene, p-methylstyrene and p-chlorostyrene, α-methylstyrene and α-methylstyrene derivatives, acrylamide, acrylonitrile, vinyl alcohol esters such as vinyl-n-butyl ester, alkyl (meth)acrylate esters, benzyl (meth) acrylate ester, tetrahydrofurfuryl (meth)acrylate ester, dimethylaminoethyl (meth)acrylate ester, diethylaminoethyl (meth)acrylate ester, glycidyl (meth)acrylate ester, 2,2,2-trifluoroethyl (meth)acrylate, 2,2,3,3-tetrafluoropropyl (meth)acrylate, (meth)acrylic acid, α-bromo(meth)acrylic acid, α-chlor(meth)acrylic acid, β-furyl(meth)acrylic acid, β-styryl(meth)acrylic acid, maleic acid, maleic anhydride, maleic acid monoesters such as monomethyl malate, monoethyl malate and monoisopropyl malate, fumaric acid, cinnamic acid, α-cyanocinnamic acid, itaconic acid, crotonic acid and propiolic acid. These may be used as single compounds or as combinations of two or more compounds.

The binder polymer is preferably one containing a carboxyl group in the molecule, from the viewpoint of the alkali developing property. The binder polymer with a carboxyl group may be produced by radical polymerization of a carboxyl group-containing polymerizable monomer and another polymerizable monomer.

From the viewpoint of balance between developing solution resistance and the release property, the binder polymer preferably contains a divalent group represented by the following general formula (III), (IV) and (V) as a structural unit. Improved developing solution resistance tends to increase the adhesiveness and resolution.

[Chemical Formula 8]

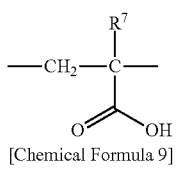

(III)

[Chemical Formula 9]

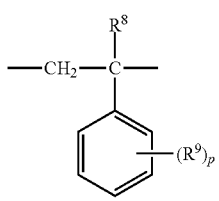

(IV)

[Chemical Formula 10]

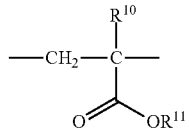

(V)

In the formulas, $R^7$, $R^8$ and $R^{10}$ each independently represent hydrogen or a methyl group, $R^9$ represents a C1-4 alkyl group, a C1-3 alkoxy group, a hydroxyl group or a halogen atom, $R^{11}$ represents a C1-6 alkyl group, p represents an integer of 0-5, and when p is 2 or greater the multiple $R^9$ groups may be the same or different.

The structural unit represented by the general formula (III) is a structural unit based on (meth)acrylic acid, and preferably it is a structural unit based on methacrylic acid ($R^7$=methyl group).

The content ratio of the structural unit represented by the general formula (III) is preferably 10 to 50 wt %, more preferably 15 to 40 wt % and even more preferably 20 to 35 wt %, based on the total solid weight of the (a) binder polymer as the copolymer. If this ratio is less than 10 wt %, the resistance against aqueous alkali solutions commonly used as developing solutions and release solutions will be improved, and development and release will tend to be hampered, while if the ratio is greater than 50 wt %, the developing solution resistance will be poor, and the adhesiveness and resolution will tend to be reduced.

The structural unit represented by the general formula (IV) is a structural unit based on styrene ($R^8$=hydrogen), a styrene derivative, α-methylstyrene ($R^8$=methyl group) or an α-methylstyrene derivative. According to the invention, "styrene derivative" and "α-methylstyrene derivative" refer to styrene and α-methylstyrene wherein a hydrogen of the benzene ring has been substituted with a substituent $R^9$ (C1-4 alkyl group, C1-3 alkoxy group, OH group or halogen atom). Examples of styrene derivatives include methylstyrene, ethylstyrene, tert-butylstyrene, methoxystyrene, ethoxystyrene, hydroxystyrene and chlorostyrene, and more preferably it is a structural unit in which $R^9$ is substituted at the p-position. An α-methylstyrene derivative may be one in which a hydrogen at the α-position of the vinyl group in one of the aforementioned styrene derivatives has been substituted with a methyl group.

The content ratio of the structural unit represented by the general formula (IV) is preferably 3 to 60 wt %, more preferably 10 to 55 wt %, even more preferably 15 to 50 wt % and most preferably 20 to 45 wt %, based on the total solid weight of the (a) binder polymer as the copolymer. If the content is less than 3 wt % the adhesiveness and resolution will tend to be reduced, and if it is greater than 60 wt % the release strip will be larger and the release time will tend to be lengthened, while the flexibility of the cured resist will also tend to be reduced.

A structural unit represented by the general formula (V) is a structural unit based on an alkyl (meth)acrylate ester. Such alkyl (meth)acrylate esters include compounds of the general formula (V) wherein $R^{11}$ is a C1-12 alkyl group. The C1-12 alkyl group may be straight-chain or branched, and optionally substituted with hydroxyl, epoxy, a halogen atom or the like. Examples of such alkyl (meth)acrylate esters include methyl (meth)acrylate, ethyl (meth)acrylate, propyl (meth)acrylate, isopropyl (meth)acrylate, butyl (meth)acrylate, tert-butyl (meth)acrylate, pentyl (meth)acrylate, hexyl (meth)acrylate, heptyl (meth)acrylate, octyl (meth)acrylate and 2-ethylhexyl (meth)acrylate, as well as structural isomers thereof. From the viewpoint of increasing resolution and shortening the release time, $R^{11}$ is preferably a C1-6 alkyl group, more preferably a C1-6 alkyl group without substituents, and even more preferably a methyl group.

The content ratio of the structural unit represented by the general formula (V) is preferably 1 to 60 wt %, more preferably 2 to 55 wt %, even more preferably 4 to 50 wt % and most preferably 5 to 50 wt %, based on the total solid weight of the (a) binder polymer as the copolymer. If the content is less than 1 wt % the release property of the resist will tend to be reduced, and if it exceeds 60 wt % the resolution will tend to be reduced.

From the viewpoint of balance between adhesiveness and resolution, and the release property, the binder polymer may further contain a divalent group represented by the following general formula (VI) as a structural unit.

[Chemical Formula 11]

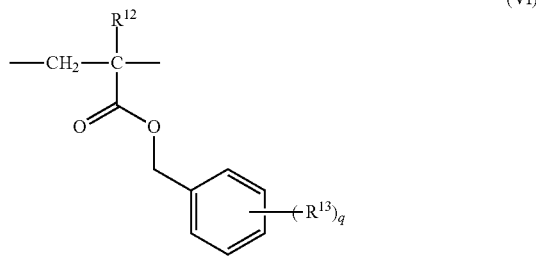

(VI)

In the formula, $R^{12}$ represents hydrogen or a methyl group, and $R^{13}$ represents a C1-4 alkyl group, a C1-3 alkoxy group, a hydroxyl group or a halogen atom. The letter q represents an integer of 0-5, and when q is 2 or greater, the multiple $R^{13}$ groups may be the same or different.

A structural unit represented by the general formula (VI) is a structural unit based on benzyl (meth)acrylate or a benzyl (meth)acrylate derivative. Examples of benzyl (meth)acrylate derivatives include 4-methylbenzyl (meth)acrylate, 4-ethylbenzyl (meth)acrylate, 4-tert-butylbenzyl (meth)acrylate, 4-methoxybenzyl (meth)acrylate, 4-ethoxybenzyl (meth)acrylate, 4-hydroxybenzyl (meth)acrylate and 4-chlorobenzyl (meth)acrylate. From the viewpoint of developability, etching resistance and plating resistance, and maintaining flexibility of the cured film, the structural unit represented by the general formula (VI) is preferably a structural unit based on benzyl (meth)acrylate (where q=0).

The content ratio of the structural unit represented by the general formula (VI) is preferably 5 to 60 wt %, more preferably 10 to 55 wt %, even more preferably 15 to 50 wt % and most preferably 20 to 45 wt %, based on the total solid weight of the (a) binder polymer as the copolymer. If the content is less than 5 wt % the adhesiveness will tend to be reduced, and if it is greater than 60 wt % the release time will tend to be lengthened, while the flexibility of the ultraviolet cured resist will also tend to be reduced.

The weight-average molecular weight of the binder polymer is preferably 30000-100000, more preferably 35000-80000 and even more preferably 40000-60000. If the weight-average molecular weight is less than 30000 the photosensitive layer will tend to be brittle, while if it is greater than 100000, strand-like development residues will tend to be generated, thus lowering the resolution. The weight-average molecular weight is that measured by gel permeation chromatography (hereinafter, "GPC") and calculated in terms of standard polystyrene.

The acid value of the binder polymer is preferably 30 to 300 mgKOH/g and more preferably 50 to 200 mgKOH/g. If the acid value is less than 30 mgKOH/g the developing time will tend to be longer, and if it is greater than 300 mgKOH/g the acidity with respect to the alkali developing solution of the photocured resist will tend to be lower.

Such binder polymers may be used alone or in combinations of two or more. Examples of binder polymer combinations, when two or more are used in combination, include two or more binder polymers composed of different copolymerizing components (including different repeating units as constituent components), two or more binder polymers with different weight-average molecular weights, and two or more binder polymers with different dispersibilities. There may also be used a polymer having a multimode molecular weight distribution, as described in JP 11-327137 A.

When development with an organic solvent is carried out as the developing step, it is preferred to adjust the carboxyl group-containing polymerizable monomer to a smaller amount. If necessary, the binder polymer may have a photosensitive group.

It is preferably that a photopolymerizable compound with an ethylenically unsaturated bond as component (b) contains a compound with 4 to 40 oxyalkylene units (alkylene glycol units) having from 2 to 6 carbon atoms, in the molecule. By including such a compound as component (b), it is possible to improve the compatibility with the (a) binder polymer.

Of these photopolymerizable compounds, a photopolymerizable compound having an ethylenically unsaturated bond as component (b) preferably contains a bisphenol A-based (meth)acrylate compound represented by the following general formula (II), since it will tend to allow the effect of the invention to be more reliably obtained.

[Chemical Formula 12]

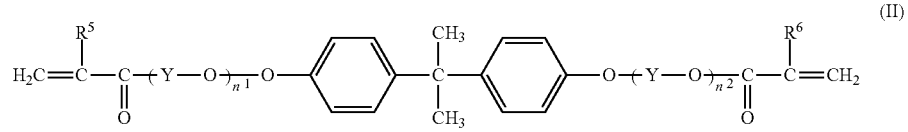

(II)

In the general formula (II), $R^5$ and $R^6$ each independently represent hydrogen or a methyl group, and preferably a methyl group. Y represents a C2-6 alkylene group. The letters $n^1$ and $n^2$ each represent a positive integer, and $n^1+n^2$ is an integer of 2-40, preferably an integer of 6-34, more preferably an integer of 8-30, even more preferably an integer of 8-28, especially preferably an integer of 8-20, very preferably an integer of 8-16 and most preferably an integer of 8-12. If the value of $n_1+n_2$ is less than 2, compatibility with the binder polymer will be reduced and the photosensitive element will tend to peel when it is laminated on a circuit-forming board, while if the value of $n_1+n_2$ is greater than 40, hydrophilicity will increase, the resist image will readily peel during development, and the plating resistance will tend to be reduced. When multiple Y groups are present in the molecule, they may be the same or different.

Examples of C2-6 alkylene groups include ethylene, propylene, isopropylene, butylene, pentylene and hexylene. Ethylene or isopropylene groups are preferred, and ethylene groups are more preferred, from the viewpoint of improving the resolution and plating resistance.

The aromatic ring in the general formula (II) may be optionally substituted. Examples of substituents include halogen atoms, C1-20 alkyl, C3-10 cycloalkyl, C6-18 aryl, phenacyl, amino, C1-10 alkylamino, C2-20 dialkylamino, nitro, cyano, carbonyl, mercapto, C1-10 alkylmercapto, allyl, hydroxyl, C1-20 hydroxyalkyl, carboxyl, carboxyalkyl with 1-10 carbon atoms in the alkyl group, acyl with 1-10 carbon atoms in the alkyl group, C1-20 alkoxy, C1-20 alkoxycarbonyl, C2-10 alkylcarbonyl, C2-10 alkenyl, C2-10 N-alkylcarbamoyl and heterocyclic ring-containing groups, as well as aryl groups substituted with these substituents. The substituents mentioned above may form fused rings, or the hydrogen atoms in the substituents may be replaced by the aforementioned substituents, such as halogen atoms. If the number of substituents is two or more, the two or more substituents may be the same or different.

Examples of compounds represented by the general formula (II) include bisphenol A-based (meth)acrylate compounds such as 2,2-bis(4-((meth)acryloxypolyethoxy)phenyl)propanes, 2,2-bis(4-((meth)acryloxypolypropoxy) phenyl)propanes, 2,2-bis(4-((meth)acryloxypolybutoxy) phenyl)propanes and 2,2-bis(4-((meth) acryloxypolyethoxypolypropoxy)phenyl)propanes.

Examples of 2,2-bis(4-((meth)acryloxypolyethoxy)phenyl)propanes include 2,2-bis(4-((meth)acryloxydiethoxy) phenyl)propane, 2,2-bis(4-((meth)acryloxytriethoxy)phenyl)propane, 2,2-bis(4-((meth)acryloxytetraethoxy)phenyl) propane, 2,2-bis(4-((meth)acryloxypentaethoxy)phenyl) propane, 2,2-bis(4-((meth)acryloxyhexaethoxy)phenyl) propane, 2,2-bis(4-((meth)acryloxyheptaethoxy)phenyl) propane, 2,2-bis(4-((meth)acryloxyoctaethoxy)phenyl) propane, 2,2-bis(4-((meth)acryloxynonaethoxy)phenyl) propane, 2,2-bis(4-((meth)acryloxydecaethoxy)phenyl) propane, 2,2-bis(4-((meth)acryloxyundecaethoxy)phenyl) propane, 2,2-bis(4-((meth)acryloxydodecaethoxy)phenyl) propane, 2,2-bis(4-((meth)acryloxytridecaethoxy)phenyl) propane, 2,2-bis(4-((meth)acryloxytetradecaethoxy)phenyl) propane, 2,2-bis(4-((meth)acryloxypentadecaethoxy) phenyl)propane and 2,2-bis(4-((meth) acryloxyhexadecaethoxy)phenyl)propane. Of these, 2,2-bis (4-(methacryloxydiethoxy)phenyl)propane is preferred, and it is commercially available as BPE-200 (trade name of Shin-Nakamura Chemical Co., Ltd.). More preferred is 2,2-bis(4-(methacryloxypentaethoxy)phenyl)propane, which is commercially available as BPE-500 (trade name of Shin-Nakamura Chemical Co., Ltd.). Also, 2,2-bis(4-(methacryloxypentadecaethoxy)phenyl)propane is commercially available as BPE-1300 (trade name of Shin-Nakamura Chemical Co., Ltd.). These may be used as single compounds or as combinations of two or more compounds.

Examples of 2,2-bis(4-((meth)acryloxypolyethoxypolypropoxy)phenyl)propanes include 2,2-bis(4-((meth)acryloxydiethoxyoctapropoxy)phenyl)propane, 2,2-bis(4-((meth)acryloxytetraethoxytetrapropoxy)phenyl)propane and 2,2-bis(4-((meth)acryloxyhexaethoxyhexapropoxy)phenyl)propane. Any of these may be used alone or in combinations of two or more.

A polyalkylene glycol di(meth)acrylate may also be suitably used as component (b). Examples of polyalkylene glycol di(meth)acrylates include compounds represented by the following general formulas (VII), (VIII) and (IX).

[Chemical Formula 13]

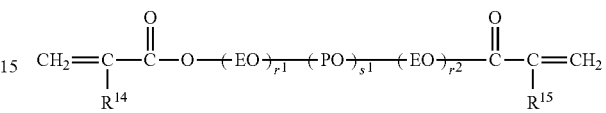

(VII)

In the formula, $R^{14}$ and $R^{15}$ each independently represent hydrogen or a methyl group, EO represents an oxyethylene group, PO represents a propyleneoxy group, $S^1$ represents an integer of 1-30, and $r^1$ and $r^2$ each represent an integer of 0 to 30, $r^1+r^2$ (mean value) being an integer of 1-30.

[Chemical Formula 14]

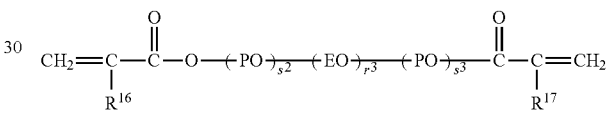

(VIII)

In the formula, $R^{16}$ and $R^{17}$ each independently represent hydrogen or a methyl group. EO represents an oxyethylene group, PO represents an oxypropylene group, $r^3$ represents an integer of 1-30, and $s^2$ and $s^3$ each represent an integer of 0 to 30, $s^2+s^3$ (mean value) being an integer of 1-30.

[Chemical Formula 15]

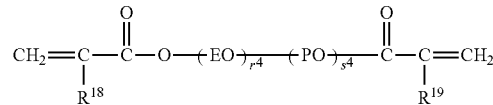

(IX)

In the formula, $R^{18}$ and $R^{19}$ each independently hydrogen or a methyl group, and preferably a methyl group. EO represents an oxyethylene group, and PO represents an oxypropylene group. The letter $r^4$ represents an integer of 1-30, and $s^4$ represents an integer of 1-30.

When multiple oxyethylene units (EO) and oxypropylene units (PO) are present in the general formulas (VII), (VIII) and (IX), the multiple oxyethylene units and oxypropylene units may each be present in a continuous block form, or they may be present in random form.

Also, when the oxypropylene unit is an oxyisopropylene unit, the secondary carbon of the propylene group may be bonded to an oxygen atom and the primary carbon may be bonded to an oxygen atom.

The total numbers of repeating oxyethylene units in the general formulas (VII), (VIII) and (IX) ($r^1+r^2$, $r^3$ and $r^4$) are each independently preferably an integer of 1 to 30, more preferably an integer of 1 to 10, even more preferably an integer of 4 to 9 and most preferably an integer of 5 to 8. If the number of repeats exceeds 30, the tent reliability and resist shape will tend to be poor.

The total numbers of repeating oxypropylene units in the general formulas (VII), (VIII) and (IX) ($s^1$, $s^2+s^3$ and $s^4$) are each independently preferably an integer of 1 to 30, more preferably an integer of 5 to 20, even more preferably an integer of 8 to 16 and most preferably an integer of 10 to 14. If the number of repeats exceeds 30, the resolution will be reduced and sludge will tend to be produced during development.

A specific example of a compound represented by the general formula (VIII) is a vinyl compound wherein $R^{14}$ and $R^{15}$ are methyl, $r^1+r^2=4$ (mean value) and $s^1=12$ (mean value) (trade name: FA-023M by Hitachi Chemical Co., Ltd.).

A specific example of a compound represented by the general formula (VIII) is a vinyl compound wherein $R^{16}$ and $R^{17}$ are methyl, $r^3=6$ (mean value) and $s^2+s^3=12$ (mean value) (trade name: FA-024M by Hitachi Chemical Co., Ltd.).

A specific example of a compound represented by the general formula (IX) is a vinyl compound wherein $R^{18}$ and $R^{19}$ are hydrogen, $r^4=1$ (mean value) and $s^4=9$ (mean value) (sample name: NK Ester HEMA-9P by Shin-Nakamura Chemical Co., Ltd.).

These may be used as single compounds or as combinations of two or more compounds.

From the viewpoint of improving the developability including adhesiveness and resolution, and also the release property, a photopolymerizable compound with one ethylenically unsaturated bond may be added to component (b). A photopolymerizable compound with one ethylenically unsaturated bond preferably includes a compound represented by the following general formula (X).

[Chemical Formula 16]

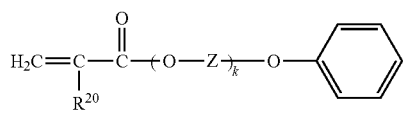

(X)

In the formula, $R^{20}$ is hydrogen or methyl, and preferably hydrogen. Z has the same definition as Y in the general formula (II), and is preferably an ethylene group. The letter k represents an integer of 4-20, and from the viewpoint of developability is preferably an integer of 5 to 18, more preferably an integer of 6 to 12 and even more preferably an integer of 6 to 10.

The aromatic ring in the general formula (X) may have a substituent, such substituents including the same substituents mentioned for the aromatic ring in the general formula (II).

Nonylphenoxypolyethyleneoxy (meth)acrylates include nonylphenoxytetraethyleneoxy (meth)acrylate, nonylphenoxypentaethyleneoxy (meth)acrylate, nonylphenoxyhexaethyleneoxy (meth)acrylate, nonylphenoxyheptaethyleneoxy (meth)acrylate, nonylphenoxyoctaethyleneoxy (meth)acrylate, nonylphenoxynonaethyleneoxy (meth)acrylate, nonylphenoxydecaethyleneoxy (meth)acrylate, nonylphenoxyundecaethyleneoxy (meth)acrylate and nonyl phenoxidedecaethyleneoxy (meth)acrylate.

Examples of butylphenoxypolyethyleneoxy (meth)acrylates include butylphenoxytetraethyleneoxy (meth)acrylate, butylphenoxypentaethyleneoxy (meth)acrylate, butylphenoxyhexaethyleneoxy (meth)acrylate, butylphenoxyheptaethyleneoxy (meth)acrylate, butylphenoxyoctaethyleneoxy (meth)acrylate, butylphenoxynonaethyleneoxy (meth)acrylate, butylphenoxydecaethyleneoxy (meth)acrylate and butylphenoxyundecaethyleneoxy (meth)acrylate. These may also be used as single compounds or as combinations of two or more compounds.

From the viewpoint of improving the tenting property, component (b) may contain a urethane monomer such as a (meth)acrylate compound with a urethane bond.

Examples of urethane monomers include addition reaction products of (meth)acrylic monomers with a hydroxyl group at the β position and diisocyanate compounds such as isophorone diisocyanate, 2,6-toluene diisocyanate, 2,4-toluene diisocyanate and 1,6-hexamethylene diisocyanate, as well as tris((meth)acryloxytetraethylene glycol isocyanate) hexamethylene isocyanurate, EO-modified urethane di(meth)acrylate and EO,PO-modified urethane di(meth)acrylate. "EO" stands for ethylene oxide, and an EO-modified compound has a block structure of ethylene oxide groups. "PO" stands for propylene oxide, and a PO-modified compound has a block structure of propylene oxide groups. An example of an EO-modified urethane di(meth)acrylate is UA-11, trade name of Shin-Nakamura Chemical Co., Ltd. An example of an EO,PO-modified urethane di(meth)acrylate is UA-13, trade name of Shin-Nakamura Chemical Co., Ltd. These may be used alone or in combinations of two or more.

Component (b) may also contain a photopolymerizable compound with an ethylenically unsaturated bond, other than one of those mentioned above. Examples of other (b) photopolymerizable compounds include compounds obtained by reacting an α,β-unsaturated carboxylic acid with a polyhydric alcohol, compounds obtained by reacting an α,β-unsaturated carboxylic acid with a glycidyl group-containing compound, and phthalic acid-based compounds, alkyl (meth)acrylate esters and the like. These may be used alone or in combinations of two or more.

Examples of compounds obtained by reacting an α,β-unsaturated carboxylic acid with a polyhydric alcohol include trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dipentaerythritol penta(meth)acrylate and dipentaerythritol hexa(meth)acrylate. These may be used alone or in combinations of two or more.

Examples of phthalic acid-based compounds include γ-chloro-β-hydroxypropyl-β'-(meth)acryloyloxyethyl-o-phthalate and β-hydroxyalkyl-β'-(meth)acryloyloxyalkyl-o-phthalate. These may also be used alone or in any desired combinations of two or more.

The concentration of ethylenically unsaturated bonds in the photosensitive layer (also "vinyl group concentration") is preferably 0.8 mmol/g to 1.6 mmol/g, more preferably 0.9 mmol/g to 1.5 mmol/g, even more preferably 1.0 mmol/g to 1.4 mmol/g and most preferably 1.1 mmol/g to 1.3 mmol/g. If the ethylenically unsaturated bond concentration is less than 0.8 mmol/g, the crosslink density of the exposed photosensitive layer will be reduced and the adhesiveness and chemical resistance will be lower, thus tending to lower the yield of products such as printed wiring boards. If the ethylenically unsaturated bond concentration exceeds 1.6 mol/g, the crosslink density of the exposed photosensitive layer will increase, tending to render the cured film brittle. As a result, since products such as printed wiring boards continue to decrease in thickness and thus become more easily bendable, risk of rupture of the resist increases and product yields tend to be lower.

The photopolymerization initiator as component (c) preferably contains a 2,4,5-triarylimidazole dimer. Examples of 2,4,5-triarylimidazole dimers include 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer and 2,2'-bis(o-chlorophenyl)-4,5,4',5'-tetraphenylimidazole dimer. From the viewpoint of further improving the adhesiveness and sensitivity, 2-(o-chlorophenyl)-4,5-diphenylimidazole dimer is preferred among those mentioned above.

Two of the aryl substituents of 2,4,5-triarylimidazole in a 2,4,5-triarylimidazole dimer may be identical to constitute a symmetrical compound, or they may be different to constitute an asymmetrical compound.

When component (c) contains a 2,4,5-triarylimidazole dimer, the content ratio of the 2,4,5-triarylimidazole dimer is preferably 70 to 100 wt %, more preferably 85 to 100 wt %, even more preferably 90 to 100 wt % and most preferably 93 to 100 wt %, based on the total weight of component (c). If a 2,4,5-triarylimidazole dimer is included in this proportion, the photosensitive element of the invention will have more excellent adhesiveness and sensitivity.

The photopolymerizable compound as component (c) also preferably contains a pyrazoline compound represented by the following general formula (XI) or (XII), together with a 2,4,5-triarylimidazole dimer. By using such a pyrazoline-based compound in component (c), it will be possible to increase the photosensitivity while maintaining the absorbance of the resist within a fixed range, and the resulting photosensitive element will be able to increase productivity for printed wiring boards.

[Chemical Formula 17]

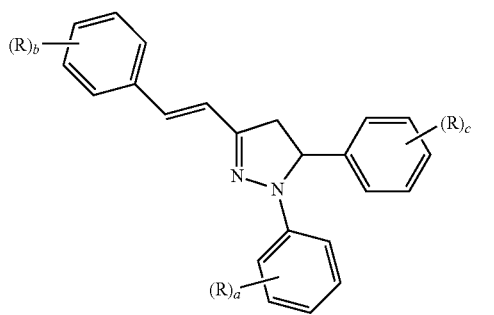

(XI)

[Chemical Formula 18]

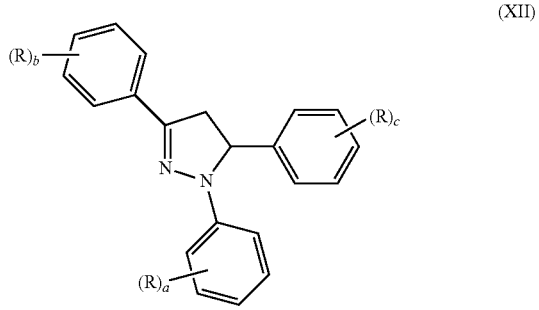

(XII)

In formulas (XI) and (XII), R each independently represents a C1-12 straight-chain or branched alkyl group, a C1-10 straight-chain or branched alkoxy group, or a halogen atom. Also, a, b and c each independently represent an integer of 0 to 5, the total of a, b and c being between 1 and 6. When the total of a, b and c is 2 or greater, the multiple R groups may be the same or different. At least one of the R groups in formula (XI) is preferably a C1-12 straight-chain or branched alkyl or C1-10 straight-chain or branched alkoxy group, more preferably a C1-3 straight-chain or branched alkyl or C1-3 straight-chain or branched alkoxy group, and even more preferably an isopropyl, methoxy or ethoxy group. At least one of the R groups in formula (XII) is preferably a C1-12 straight-chain or branched alkyl or C1-10 straight-chain or branched alkoxy group, more preferably a C1-4 straight-chain or branched alkyl or C1-4 straight-chain or branched alkoxy group, and even more preferably a tert-butyl, isopropyl, methoxy or ethoxy group.

Specific examples of pyrazoline compounds represented by formula (XI) include 1-(4-methoxyphenyl)-3-styryl-5-phenyl-pyrazoline, 1-phenyl-3-(4-methoxystyryl)-5-(4-methoxyphenyl)-pyrazoline, 1-phenyl-3-(4-methoxystyryl)-5-(4-tert-butyl-phenyl)-pyrazoline, 1,5-bis-(4-methoxyphenyl)-3-(4-methoxystyryl)-pyrazoline, 1-(4-isopropylphenyl)-3-styryl-5-phenyl-pyrazoline, 1-phenyl-3-(4-isopropylstyryl)-5-(4-isopropylphenyl)-pyrazoline, 1,5-bis-(4-isopropylphenyl)-3-(4-isopropylstyryl)-pyrazoline, 1-(4-methoxyphenyl)-3-(4-tert-butyl-styryl)-5-(4-tert-butyl-phenyl)-pyrazoline, 1-(4-tert-butyl-phenyl)-3-(4-methoxystyryl)-5-(4-methoxyphenyl)-pyrazoline, 1-(4-isopropyl-phenyl)-3-(4-tert-butyl-styryl)-5-(4-tert-butyl-phenyl)-pyrazoline, 1-(4-tert-butyl-phenyl)-3-(4-isopropyl-styryl)-5-(4-isopropyl-phenyl)-pyrazoline, 1-(4-methoxyphenyl)-3-(4-isopropylstyryl)-5-(4-isopropylphenyl)-pyrazoline, 1-(4-isopropyl-phenyl)-3-(4-methoxystyryl)-5-(4-methoxyphenyl)-pyrazoline and 1-phenyl-3-(3,5-dimethoxystyryl)-5-(3,5-dimethoxyphenyl)-pyrazoline. Of these, 1-phenyl-3-(4-methoxystyryl)-5-(4-methoxyphenyl)pyrazoline or 1-phenyl-3-(4-methoxyphenyl)-5-(4-t-butyl-phenyl)pyrazoline is preferably included from the viewpoint of adjusting the absorbance for the thickness of the photosensitive layer, and providing a photosensitive resin composition with an excellent resist shape.

Pyrazoline compounds represented by formula (XII) include 1-phenyl-3-phenyl-5-(4-isopropylphenyl)pyrazoline, 1-(4-tert-butyl-phenyl)-3,5-diphenyl-pyrazoline, 1,5-diphenyl-3-(4-tert-butyl-phenyl)-pyrazoline, 1,3-diphenyl-5-(4-tert-butyl-phenyl)-pyrazoline, 1-(4-isopropyl-phenyl)-3,5-diphenyl-pyrazoline, 1,5-diphenyl-3-(4-isopropyl-phenyl)-pyrazoline, 1,3-diphenyl-5-(4-isopropyl-phenyl)-pyrazoline, 1-(4-methoxy-phenyl)-3,5-diphenyl-pyrazoline, 1,5-diphenyl-3-(4-methoxy-phenyl)-pyrazoline, 1,3-diphenyl-5-(4-methoxy-phenyl)-pyrazoline, 1,3-bis(4-tert-butyl-phenyl)-5-phenyl-pyrazoline, 1,5-bis(4-tert-butyl-phenyl)-3-phenyl-pyrazoline, 1-phenyl-3,5-bis(4-tert-butyl-phenyl)-pyrazoline, 1,3,5-tri(4-tert-butyl-phenyl)-pyrazoline, 1,3-bis(4-isopropyl-phenyl)-5-phenyl-pyrazoline, 1,5-bis(4-isopropyl-phenyl)-3-phenyl-pyrazoline, 1-phenyl-3,5-bis(4-isopropyl-phenyl)-pyrazoline, 1,3,5-tri(4-isopropyl-phenyl)-pyrazoline, 1,3-bis(4-methoxy-phenyl)-5-phenyl-pyrazoline and 1,5-bis(4-methoxy-phenyl)-3-phenyl-pyrazoline. Of these, 1-phenyl-3-phenyl-5-(4-isopropylphenyl)pyrazoline is preferably included from the viewpoint of adjusting the absorbance for the thickness of the photosensitive layer, and providing a photosensitive resin composition with an excellent resist shape.

These pyrazoline compounds are available as commercial products from Nippon Chemical Industrial Co., Ltd., or they may be synthesized by the methods described in JP 2931693 B, JP 2757528 B, JP 2972373 B, JP 3215718 B, JP 3312756 B and elsewhere.

When component (c) contains a pyrazoline compound represented by the following general formula (XI) or (XII) together with a 2,4,5-triarylimidazole dimer, the content is preferably 0.5 to 6.0 wt %, more preferably 1.0 to 5.0 wt % and even more preferably 1.0 to 4.0 wt % based on the total amount of component (c).

As the photopolymerization initiator as component (c) there may also be used another photopolymerization initiator, in addition to the 2,4,5-triarylimidazole dimer and pyrazoline compound. Examples of other photopolymerization initiators include aromatic ketones, p-aminophenyl ketones, quinones, benzoinether compounds, benzoin compounds, benzyl derivatives, acridine derivatives, coumarin-based compounds, oxime esters, N-aryl-α-amino acid compounds, aliphatic polyfunctional thiol compounds, acylphosphine oxides, thioxanthones, tertiary amine compounds and the like, and these compounds may be used in combination.

The (c) photopolymerization initiator preferably contains one of the aforementioned aromatic ketones in addition to a 2,4,5-triarylimidazole dimer or pyrazoline compound, and preferably it contains N,N'-tetraethyl-4,4'-diaminobenzophenone (Michler's ketone).

The content of the binder polymer as component (a) is preferably 40-70 parts by weight, more preferably 45-65 parts by weight and even more preferably 50-60 parts by weight based on 100 parts by weight as the total of component (a) and component (b). If the content is less than 40 parts by weight the photocured product will tend to be fragile, and if it is greater than 70 parts by weight the resolution and photosensitivity will tend to be insufficient.

The content of the photopolymerizable compound with an ethylenically unsaturated bond as component (b) is preferably 30 to 60 parts by weight, more preferably 35 to 55 parts by weight and even more preferably 40 to 50 parts by weight based on 100 parts by weight as the total of component (a) and component (b). If the content is less than 30 parts by weight the resolution and photosensitivity will tend to be insufficient, and if it is greater than 60 parts by weight the photocured product will tend to be fragile.

The content of the photopolymerization initiator as component (c) is preferably 0.1 to 20 parts by weight, more preferably 0.2 to 10 parts by weight and even more preferably 0.5 to 5 parts by weight with respect to 100 parts by weight as the total of component (a) and component (b). If the content is less than 0.1 part by weight the photosensitivity will tend to be insufficient, and if it is greater than 20 parts by weight the photoabsorption on the surface of the photosensitive resin composition during exposure will increase, tending to result in insufficient photocuring of the interior.

The photosensitive resin composition may also contain, if necessary, additives such as photopolymerizable compounds with at least one cationic polymerizable cyclic ether group in the molecule (oxetane compounds, etc.), cationic polymerization initiators, dyes such as malachite green, photochromic agents such as tribromophenylsulfone and leuco crystal violet, thermal development inhibitors, plasticizers such as p-toluenesulfonamide, pigments, fillers, antifoaming agents, flame retardants, stabilizers, inhibitors, leveling agents, release promoters, antioxidants, aromatics, imaging agents, and thermal crosslinking agents. Any of these may be used alone or in combinations of two or more. These additives may be included at about 0.0001 to 20 parts by weight each based on 100 parts by weight as the total of component (a) and component (b), so long as the object of the invention is not hindered.

The photosensitive resin composition may, if necessary, be coated as a solution in a solvent such as methanol, ethanol, acetone, methyl ethyl ketone, methylcellosolve, ethylcellosolve, toluene, N,N-dimethylformamide or propylene glycol monomethyl ether, or a mixture of such solvents, prepared to a solid content of about 30 to 60 wt %.

The photosensitive layer 20 of the photosensitive element 1 of the invention may be formed by coating the photosensitive resin composition onto the support film 10 and removing the solvent. Examples of coating methods that may be employed include known methods such as roll coating, comma coating, gravure coating, air knife coating, die coating and bar coating. The solvent removal can be carried out, for example, at a temperature of 70° C. to 150° C. for about 5 to 30 minutes. The amount of residual organic solvent in the photosensitive layer 20 is preferably no greater than 2 wt % from the viewpoint of preventing diffusion of the organic solvent in subsequent steps.

The thickness (T) of the photosensitive layer 20 formed in this manner is preferably 2-30 μm, more preferably 5-25 μm, even more preferably 7-20 μm and most preferably 10-20 μm, as the post-drying thickness. A thickness of less than 2 μm may result in more inconveniences when the photosensitive layer is laminated on the circuit-forming board, or an inferior tenting property, damage to the resist during the development and etching steps, and potentially causing open failures, thus tending to lower production yield of the printed wiring board. On the other hand, a thickness of greater than 30 μm will lower the resolution of the photosensitive layer 20 or impair the liquid movement of the etching solution, thereby increasing the effects of side etching and hampering production of high-density printed wiring boards.

The absorbance (a) of the photosensitive layer 20 at 365 nm is preferably 0.01-0.60, more preferably 0.05-0.55 and even more preferably 0.10-0.50. With an absorbance of less than 0.01 it will not be possible to obtain sufficient sensitivity and formation of a resist pattern will be more difficult, while an absorbance of greater than 0.60 increases the amount of light absorbed on the top parts of the exposed sections, resulting in insufficient photocuring reaction at the bottom parts of the exposed sections, tending to result in an inverted trapezoid resist shape after development.

The photosensitive element 1 may comprise a protective film (not shown) on the main side of the photosensitive layer 20 opposite the first main side 12 that contacts the support film 10. The protective film is preferably a film such that the adhesive force between the photosensitive layer 20 and protective film is lower than the adhesive force between the photosensitive layer 20 and the support film 10, and preferably a low fisheye film is used. As examples of protective films there may be mentioned, specifically, inactive polyolefin films such as polyethylene and polypropylene. From the viewpoint of releasability from the photosensitive layer 20, a polyethylene film is preferred. The thickness of the protective film is preferably about 1-100 μm, although this will differ depending on the purpose of use.

The photosensitive element 1 may also comprise interlayers such as a cushion layer, adhesive layer, photoabsorbing layer and gas barrier layer, or protective layers in addition to the support film 10, the photosensitive layer 20 and the protective film.

The photosensitive element 1 of this embodiment may be stored in a condition where it is rolled around a cylindrical winding core, either alone or having a protective film further laminated on the photosensitive layer 20. In this case, it is preferably wound into a roll in such a manner that the support film 10 is the outermost layer. From the viewpoint of edge protection, an edge separator is preferably situated at the edge of the photosensitive element 1 that has been wound into a roll, while from the viewpoint of preventing edge fusion, the edge separator is preferably moisture-proof. The packaging method is preferably one that involves bundling in a black sheet with low moisture permeability.

The material of the winding core may be a plastic such as polyethylene resin, polypropylene resin, polystyrene resin, polyvinyl chloride resin or ABS resin (acrylonitrile-butadiene-styrene copolymer).

(Method for Forming Resist Pattern)

The method for forming a resist pattern according to this embodiment is a method comprising a lamination step in which the photosensitive element 1 is laminated on a circuit-forming board beginning with the photosensitive layer 20 and following with the support film 10, an exposure step in which prescribed sections of the photosensitive layer 20 are irradiated with active light rays through the support film 10 to form photocured sections on the photosensitive layer 20, and a developing step in which the non-photocured sections of the photosensitive layer 20 are removed.

The method of laminating the photosensitive layer 20 on the circuit-forming board in the lamination step may be, for example, a laminating method in which the protective film is removed if a protective film is present on the photosensitive layer 20, and then the photosensitive layer 20 is contact bonded to the circuit-forming board at a pressure of about 0.1-1 MPa while heating to about 70° C. to 130° C. The lamination in this lamination step may also be carried out under reduced pressure. The laminating surface of the circuit-forming board will usually be a metal surface, but this is not restrictive. For further improved laminating properties, the circuit-forming board may be subjected to preheating treatment.

Next, a photomask with a negative or positive mask pattern is bonded onto the photosensitive layer 20 that has been laminated in the lamination step, being positioned on the second main side 14 of the support film 10. In the subsequent exposure step, the photosensitive layer 20 is irradiated with active light rays through the support film 10 in the form of an image, and photocured sections are formed on the photosensitive layer 20. The light source for the active light rays may be a known light source such as, for example, a carbon arc lamp, mercury vapor arc lamp, high-pressure mercury lamp, xenon lamp or the like, which efficiently emits ultraviolet rays or visible light. Laser direct writing exposure may also be employed to form photocured sections on the photosensitive layer 20.

After the exposure step, the photomask is released from the support film 10. The support film 10 is also released and removed from the photosensitive layer 20. In the exposure step, development may then be performed by removing the unexposed sections (non-photocured sections) of the photosensitive layer 20 by wet development using a developing solution such as an aqueous alkali solution, aqueous developing solution or organic solvent, or dry development, to produce a resist pattern.

Examples of aqueous alkali solutions include a 0.1 to 5 wt % sodium carbonate dilute solution, a 0.1 to 5 wt % potassium carbonate dilute solution and a 0.1 to 5 wt % sodium hydroxide dilute solution. The pH of the aqueous alkali solution is preferably in the range of 9-11, and the temperature is adjusted as appropriate for the developing property of the photosensitive layer 20. The aqueous alkali solution may also contain added surfactants, antifoaming agents, organic solvents and the like. The developing system may be, for example, a dip system, spray system, brushing system or slapping system.

Treatment following the developing step may consist of heating at about 60° C. to 250° C. or exposure at an exposure dose of about 0.2-10 J/cm$^2$, if necessary, for further curing of the resist pattern.

(Method for Producing Printed Wiring Board)

The method for producing a printed wiring board according to this embodiment may be carried out by etching or plating the circuit-forming board having the resist pattern formed by the method for forming a resist pattern described above. The etching or plating of the circuit-forming board is accomplished by etching or plating the surface of the circuit-forming board by a known process using the developed resist pattern as a mask.

The etching solution used for etching may be, for example, a cupric chloride solution, ferric chloride solution, alkali etching solution or the like.

Examples of methods for plating include copper plating, solder plating, nickel plating, gold plating and the like.

After the etching or plating, the resist pattern may be released, for example, with an aqueous solution of stronger alkalinity than the aqueous alkali solution used for development. The strongly alkaline water-soluble solution used here may be, for example, a 1 to 10 wt % sodium hydroxide water-soluble solution or a 1 to 10 wt % potassium hydroxide water-soluble solution. The releasing system may be, for example, a dipping system, spray system or the like. The printed wiring board on which the resist pattern has been formed may be a multilayer printed wiring board, and it may also have small through-holes.

When the plating is carried out for a circuit-forming board provided with an insulating layer and a conductive layer formed on the insulating layer, the sections of the conductive layer other than the pattern must be removed. Examples of removal methods include a method of releasing the resist pattern and then lightly etching, and a method of performing solder plating or the like after plating and then releasing the resist pattern to leave a solder mask on the wiring sections, and finally carrying out treatment using an etching solution capable of etching only the conductive layer.

(Method for Producing Semiconductor Package Substrate)

The photosensitive element 1 of the invention may be used in a package board comprising a rigid board and an insulating film formed on the rigid board. In this case, the photocured section of the photosensitive layer may be used as the insulating film. When the photocured section of the photosensitive layer is to be used as the solder resist for a semiconductor package, for example, it is preferably exposed to ultraviolet irradiation with a high-pressure mercury lamp or to heating, upon completion of the development in the method for forming a resist pattern described above, in order to improve the soldering heat resistance and chemical resistance. In the case of ultraviolet irradiation, the exposure dose may be adjusted if necessary for irradiation with an exposure dose of, for example, about 0.2-10 J/cm$^2$. When the resist pattern is to be heated, the heating is preferably carried out in a range of about 100° C. to 170° C. for about 15 to 90 minutes. Ultraviolet irradiation and heating may also be carried out simultaneously, or either one may be carried out before or after the other. When ultraviolet ray exposure and heating are carried out simultaneously, the heating is preferably at 60° C. to 150° C. from the viewpoint of more effectively imparting soldering heat resistance and chemical resistance.

The solder resist also serves as a protecting film for wiring after soldering onto the substrate, and exhibits excellent physical properties including tensile strength and elongation percentage as well as thermal shock resistance, and it is therefore effective as a permanent mask for a semiconductor package.

A package board comprising such a resist pattern is later mounted on a semiconductor element or the like (for example, by wire bonding or soldering connection), and is installed in an electronic device such as a personal computer.

The invention was explained by the embodiments described above, but it is in no way limited to those embodiments. The invention may also be applied in a variety of modifications so long as the gist thereof is maintained.

EXAMPLES

The present invention will now be explained in detail by examples, with the understanding that the invention is not limited to the examples.

(Preparation of Basic Solutions for Photosensitive Resin Compositions)

First, binder polymers having the compositions listed in Table 1 were synthesized according to the following synthesis examples.

Synthesis Example 1

In a flask equipped with a stirrer, reflux condenser, thermometer, dropping funnel and nitrogen gas inlet tube there was added 420 g of a mixture of toluene and methylcellosolve in a weight ratio of 6:4, and the mixture was stirred while blowing in nitrogen gas and heated to 80° C. Separately, as copolymerizing monomer there was prepared a mixed solution of 162 g of methacrylic acid, 30 g of methyl methacrylate, 270 g of styrene, 270 g of benzyl methacrylate and 4.4 g of azobisisobutyronitrile (hereinafter referred to as "solution a"), and, over a period of 4 hours, solution "a" was added dropwise to the mixture of toluene and methylcellosolve in a weight ratio of 6:4, that had been heated to 80° C. Next, 40 g of the mixture of toluene and methylcellosolve in a weight ratio of 6:4 was used for rinsing of the dropping funnel and added into the flask, and heating was then performed for 2 hours while stirring at 80° C. Also, a solution of 1.0 g of azobisisobutyronitrile dissolved in 40 g of a mixture of methylcellosolve and toluene in a weight ratio of 6:4 was further added dropwise to the flask over a period of 30 minutes. Next, 120 g of the mixture of toluene and methylcellosolve in a weight ratio of 6:4 was used for rinsing of the dropping funnel, and added into the flask. After keeping the dropped solution at 80° C. for 3 hours while stirring, it was heated to 90° C. over a period of 30 minutes. The solution was warmed at 90° C. for 2 hours, and then cooled to obtain a binder polymer solution as component (a). Toluene was added to the binder polymer solution to adjust the non-volatilizing component concentration (solid concentration) to 40 wt %. The weight-average molecular weight of the binder polymer was 45000. This was measured by gel permeation chromatography (GPC), and calculation was performed using a standard polystyrene calibration curve.

The GPC conditions were as follows. The acid value of the binder polymer was measured by the following procedure, resulting in an acid value of 107 mgKOH/g.

Synthesis Example 2

A binder polymer solution as component (a) was obtained by the same procedure as Synthesis Example 1, except that as the copolymerizing monomer there was prepared a mixed solution of 150 g of methacrylic acid, 300 g of methyl methacrylate, 150 g of styrene and 4.4 g of azobisisobutyronitrile (hereunder referred to as "solution b"). Toluene was added to the binder polymer solution to adjust the non-volatilizing component concentration (solid concentration) to 40 wt %. The weight-average molecular weight of the binder polymer was 45000. The acid value of the binder polymer was 121 mgKOH/g.

(GPC Conditions)

Pump: Hitachi L-6000 (trade name of Hitachi, Ltd.).
Column: Gelpack GL-R420+Gelpack GL-R430+Gelpack GL-R440M (total: 3) (all trade names of Hitachi Chemical Co., Ltd.)
Eluent: tetrahydrofuran
Measuring temperature: 40° C.
Flow rate: 2.05 mL/min
Detector: Hitachi L-3300 RI (trade name of Hitachi, Ltd.).

(Measurement of Acid Value)

Synthesized binder polymer was weighed out into an Erlenmeyer flask, a mixed solvent (weight ratio: toluene/methanol=70/30) was added for dissolution, and then a phenolphthalein solution was added as an indicator for titration with an N/10 potassium hydroxide alcohol solution, to measure the acid value.

TABLE 1

|  |  | a-1 | a-2 |
|---|---|---|---|
| Charging amount during synthesis (g) | Methacrylic acid | 162 | 150 |
|  | Methyl methacrylate | 30 | 300 |
|  | Styrene | 270 | 150 |
|  | Benzyl methacrylate | 270 | — |
|  | Azobisisobutyronitrile | 5.40 | 5.40 |
| Mass ratio (%) | Methacrylic acid | 27 | 25 |
|  | Methyl methacrylate | 5 | 50 |
|  | Styrene | 45 | 25 |
|  | Benzyl methacrylate | 23 | — |
| Properties | Weight-average molecular weight | 45000 | 45000 |
|  | Acid value (mgKOH/g) | 107 | 121 |

The components were combined in the amounts (g) listed in Tables 2 to 4 below to prepare photosensitive resin composition solutions for the examples and comparative examples. The values in parentheses with the component (a) contents indicate the solid contents.

TABLE 2

|  |  | Example | | | | | | | | | |
|---|---|---|---|---|---|---|---|---|---|---|---|
|  |  | 1 | 2 | 3 | 4 | 5 | 6 | 7 | 8 | 9 | 10 |
| Component (a) | a-1 | 145 (58) | 145 (58) | 145 (58) | 145 (58) | 145 (58) | 145 (58) | 145 (58) | 145 (58) | 145 (58) | 145 (58) |
|  | a-2 | — | — | — | — | — | — | — | — | — | — |
| Component (b) | b-1 | 27 | 27 | 27 | 27 | 27 | 27 | 27 | 27 | 27 | 27 |
|  | b-2 | 10 | — | 10 | — | — | — | — | — | — | 10 |
|  | b-3 | 5 | 5 | 5 | 5 | 5 | 5 | 5 | 5 | 5 | 5 |
|  | b-4 | — | 10 | — | — | — | — | — | — | — | — |
|  | b-5 | — | — | — | 10 | — | — | — | — | — | — |
|  | b-6 | — | — | — | — | 10 | — | — | — | — | — |

TABLE 2-continued

|  |  | Example |  |  |  |  |  |  |  |  |  |
|---|---|---|---|---|---|---|---|---|---|---|---|
|  |  | 1 | 2 | 3 | 4 | 5 | 6 | 7 | 8 | 9 | 10 |
|  | b-7 | — | — | — | — | — | 10 | — | — | — | — |
|  | b-8 | — | — | — | — | — | — | 10 | — | — | — |
|  | b-9 | — | — | — | — | — | — | — | 10 | — | — |
|  | b-10 | — | — | — | — | — | — | — | — | 10 | — |
| Component (c) | c-1 | 2.9 | 2.9 | 2.9 | 2.9 | 2.9 | 2.9 | 2.9 | 2.9 | 2.9 | 3.7 |
|  | c-2 | 0.04 | 0.12 | 0.12 | 0.12 | 0.12 | 0.12 | 0.12 | 0.12 | 0.12 | 0.12 |
|  | c-3 | — | — | — | — | — | — | — | — | — | — |
|  | c-4 | — | — | — | — | — | — | — | — | — | — |
|  | c-5 | — | — | — | — | — | — | — | — | — | — |
| Other | 4-t-Butylatechol | 0.02 | 0.02 | 0.02 | 0.02 | 0.02 | 0.02 | 0.02 | 0.02 | 0.02 | 0.02 |
|  | Leuco crystal violet | 0.30 | 0.30 | 0.30 | 0.30 | 0.30 | 0.30 | 0.30 | 0.30 | 0.30 | 0.30 |
|  | Malachite green | 0.03 | 0.03 | 0.03 | 0.03 | 0.03 | 0.03 | 0.03 | 0.03 | 0.03 | 0.03 |
| Solvent | Methanol | 5 | 5 | 5 | 5 | 5 | 5 | 5 | 5 | 5 | 5 |
|  | Acetone | 9 | 9 | 9 | 9 | 9 | 9 | 9 | 9 | 9 | 9 |
|  | Toluene | 5 | 5 | 5 | 5 | 5 | 5 | 5 | 5 | 5 | 5 |

TABLE 3

|  |  | Example |  |  |  |  |  |  |  |  |  |
|---|---|---|---|---|---|---|---|---|---|---|---|
|  |  | 11 | 12 | 13 | 14 | 15 | 16 | 17 | 18 | 19 | 20 |
| Component (a) | a-1 | 145 (58) | 145 (58) | 145 (58) | 145 (58) | 145 (58) | 145 (58) | 145 (58) | 145 (58) | 145 (58) | — |
|  | a-2 | — | — | — | — | — | — | — | — | — | 138 (55) |
| Component (b) | b-1 | 27 | 27 | 27 | 27 | 27 | 27 | 27 | 27 | 27 | 30 |
|  | b-2 | 10 | 10 | 10 | 10 | 10 | 10 | 10 | 10 | 10 | 10 |
|  | b-3 | 5 | 5 | 5 | 5 | 5 | 5 | 5 | 5 | 5 | 5 |
|  | b-4 | — | — | — | — | — | — | — | — | — | — |
|  | b-5 | — | — | — | — | — | — | — | — | — | — |
|  | b-6 | — | — | — | — | — | — | — | — | — | — |
|  | b-7 | — | — | — | — | — | — | — | — | — | — |
|  | b-8 | — | — | — | — | — | — | — | — | — | — |
|  | b-9 | — | — | — | — | — | — | — | — | — | — |
|  | b-10 | — | — | — | — | — | — | — | — | — | — |
| Component (c) | c-1 | 2.9 | 2.9 | 2.9 | 2.9 | 2.9 | 2.9 | 2.9 | 2.9 | 2.9 | 2.9 |
|  | c-2 | — | — | — | 0.12 | 0.12 | 0.12 | 0.12 | 0.12 | 0.12 | 0.12 |
|  | c-3 | 0.12 | — | — | — | — | — | — | — | — | — |
|  | c-4 | — | 0.12 | — | — | — | — | — | — | — | — |
|  | c-5 | — | — | 0.10 | — | — | — | — | — | — | — |
| Other | 4-t-Butylcatechol | 0.02 | 0.02 | 0.03 | 0.02 | 0.02 | 0.02 | 0.02 | 0.02 | 0.02 | 0.03 |
|  | Leuco crystal violet | 0.30 | 0.30 | 0.30 | 0.30 | 0.30 | 0.30 | 0.30 | 0.30 | 0.30 | 0.30 |
|  | Malachite green | 0.03 | 0.03 | 0.03 | 0.03 | 0.03 | 0.03 | 0.03 | 0.03 | 0.03 | 0.03 |
| Solvent | Methanol | 5 | 5 | 5 | 5 | 5 | 5 | 5 | 5 | 5 | 5 |
|  | Acetone | 9 | 9 | 9 | 9 | 9 | 9 | 9 | 9 | 9 | 9 |
|  | Toluene | 5 | 5 | 5 | 5 | 5 | 5 | 5 | 5 | 5 | 5 |

TABLE 4

|  |  | Comparative Example |  |  |  |  |  |  |
|---|---|---|---|---|---|---|---|---|
|  |  | 1 | 2 | 3 | 4 | 5 | 6 | 7 |
| Component (a) | a-1 | 145 (58) | 145 (58) | 145 (58) | 145 (58) | 145 (58) | 145 (58) | 145 (58) |
|  | a-2 | — | — | — | — | — | — | — |
| Component (b) | b-1 | 27 | 27 | 27 | 27 | 27 | 27 | 27 |
|  | b-2 | 10 | 10 | 10 | 10 | 10 | 10 | 10 |
|  | b-3 | 5 | 5 | 5 | 5 | 5 | 5 | 5 |
|  | b-4 | — | — | — | — | — | — | — |
|  | b-5 | — | — | — | — | — | — | — |
|  | b-6 | — | — | — | — | — | — | — |
|  | b-7 | — | — | — | — | — | — | — |
|  | b-8 | — | — | — | — | — | — | — |
|  | b-9 | — | — | — | — | — | — | — |
|  | b-10 | — | — | — | — | — | — | — |
| Component (c) | c-1 | 2.9 | 2.9 | 2.9 | 2.9 | 2.9 | 2.9 | 2.9 |
|  | c-2 | 0.20 | — | — | — | — | 0.12 | 0.12 |
|  | c-3 | — | — | — | — | — | — | — |

TABLE 4-continued

|  |  | Comparative Example | | | | | | |
|---|---|---|---|---|---|---|---|---|
|  |  | 1 | 2 | 3 | 4 | 5 | 6 | 7 |
|  | c-4 | — | — | — | — | — | — | — |
|  | c-5 | — | 0.15 | 0.20 | 0.20 | 0.20 | — | — |
| Other | 4-t-Butylatechol | 0.02 | 0.03 | 0.03 | 0.03 | 0.03 | 0.02 | 0.02 |
|  | Leuco crystal violet | 0.30 | 0.30 | 0.30 | 0.30 | 0.30 | 0.30 | 0.30 |
|  | Malachite green | 0.03 | 0.03 | 0.03 | 0.03 | 0.03 | 0.03 | 0.03 |
| Solvent | Methanol | 5 | 5 | 5 | 5 | 5 | 5 | 5 |
|  | Acetone | 9 | 9 | 9 | 9 | 9 | 9 | 9 |
|  | Toluene | 5 | 5 | 5 | 5 | 5 | 5 | 5 | b-1: FA-321M (EO-modified bisphenol A dimethacrylate, total EO number (mean value) = 10, trade name of Hitachi Chemical Co., Ltd.)
b-2: BPE-200 (EO-modified bisphenol A dimethacrylate, total EO number (mean value) = 10, trade name of Shin-Nakamura Chemical Co., Ltd.)
b-3: FA-MECH (γ-chloro-2-hydroxypropyl-β'-methacryloyloxyethyl-o-phthalate, trade name of Hitachi Chemical Co., Ltd.)
b-4: BPE-100 (EO-modified bisphenol A dimethacrylate, total EO number (mean value) = 2.6, trade name of Shin-Nakamura Chemical Co., Ltd.)
b-5: BPE-900 (EO-modified bisphenol A dimethacrylate, total EO number (mean value) = 17, trade name of Shin-Nakamura Chemical Co., Ltd.)
b-6: BPE-1300N (EO-modified bisphenol A dimethacrylate, total EO number (mean value) = 30, trade name of Shin-Nakamura Chemical Co., Ltd.)
b-7: NP-4EA (nonylphenoxypolyethylene glycol acrylate, total EO number (mean value) = 4, trade name of Kyoeisha Chemical Co., Ltd.)
b-8: NP-8EA (nonylphenoxypolyethylene glycol acrylate, total EO number (mean value) = 8, trade name of Kyoeisha Chemical Co., Ltd.)
b-9: SR-454 (EO-modified trimethylolpropane triacrylate, total EO number (mean value) = 3, trade name of Kayaku-Sartomer)
b-10: FA-024M (PO-modified ethylene glycol dimethacrylate, trade name of Hitachi Chemical Co., Ltd.)
c-1: 2-(o-Chlorophenyl)-4,5-diphenylimidazole dimer
c-2: 1-Phenyl-3-(4-methoxystyryl)-5-(4-methoxypheny)pyrazoline
c-3: 1-Phenyl-3-(4-methoxyphenyl)-5-(4-t-butylphenyl)pyrazoline
c-4: 1-Phenyl-3-phenyl-5-(4-isopropylphenyl)pyrazoline
c-5: N,N'-tetraethyl-4,4'-diaminobenzophenone (Fabrication of Photosensitive Elements)

The following PET films were used as photosensitive element support films. The results for the number of particles of 5 μm and greater in each PET film, and the haze values, are shown in Tables 5 to 7.

<Support Film>

Three-layer structure biaxially oriented PET film with fine particle-containing layer on front and back: FB40 (trade name of Toray Co., Ltd.)

Two-layer structure biaxially oriented PET film with fine particles on only one side: A-1517 (trade name of Toyobo, Ltd.)

Three-layer structure biaxially oriented PET film with fine particle-containing layer on front and back: HTR-02 (trade name of Teijin DuPont, Ltd.)

The number of such particles is the value measured using a polarizing microscope, as the number of particles of 5 μm and greater present per 1 $mm^2$ unit. The value of n was 5. The haze value is the value measured according to JIS K 7105. The thicknesses of the support films were all 16 μm.

The aforementioned photosensitive resin composition solution was coated to an even thickness onto each PET film, and dried for 5 minutes with a hot air convection current dryer at 100° C. to remove the solvent. After drying, the photosensitive layer was covered with a polyethylene film (trade name: "NF-15" by Tamapoly Co., Ltd., thickness: 20 μm) as a protective film to obtain a photosensitive element. The coating amount of the photosensitive resin composition solution was adjusted so that the thickness of the dried photosensitive layer was the thickness T as listed in Tables 5 to 7.

(Fabrication of Laminated Body)

After rinsing the copper surface of a non-adhesive two-layer plated FPC substrate, METALOYAL PI-38N-CCS-E (trade name of Toray Advanced Film Co., Ltd., polyimide: KAPTONE 150EN (product of Toray-DuPont Co., Ltd.), polyimide thickness: 38 μm, copper plating layer: none) copper foil (thickness: 35 μm), it was dried with an air stream. The obtained FPC substrate was heated to 80° C., and the photosensitive element was laminated while peeling off the protective film, in such a manner that the photosensitive layer was in contact with the copper surface. Laminated bodies were thus obtained each comprising an FPC substrate, a photosensitive layer and a support film laminated in that order. The lamination was carried out using a heat roll at 120° C., with a contact bonding pressure of 0.4 MPa and a roll speed of 1.5 m/min. The laminated bodies were used as test strips for the following tests.

(Measurement of Minimum Development Time)

The test strip was cut to a 125 mm×200 mm size, the support film was released, and then a 1 wt % aqueous sodium carbonate at 30° C. was used for spray development of the non-exposed photosensitive layer, and the time until complete removal of the unexposed sections was measured and recorded as the minimum development time. The measurement results are shown in Tables 5 to 7.

(Photosensitivity Measurement Test)

A 41-step tablet (product of Hitachi Chemical Co., Ltd.) was placed as a negative on the support film of the test strip, and an exposure device with a high-pressure mercury lamp (trade name: "EXM-1201" by Orc Manufacturing Co., Ltd.) and an i-ray band-pass filter were used for exposure of the photosensitive layer at a prescribed irradiating energy dose for 11 post-development resist curing steps. The support film was released, and 1 wt % aqueous sodium carbonate at 30° C. was sprayed for twice the minimum developing time to remove the unexposed sections, for development. Upon confirming 11 steps of the step tablet of the photocured film formed on the copper-clad laminate, the exposure dose at this time was used as the prescribed irradiation energy dose for each photosensitive layer. The results are shown in Tables 5 to 7.

(Resolution Measurement Test)

In order to investigate the resolution, a phototool with a Stouffer 41-step tablet and a glass chromium-type phototool having a wiring pattern with a line width/space width of 2/2-30/30 (units: μm) as a negative for evaluation of resolution were adhered to the support film of the test strip, and an exposure device equipped with a high-pressure mercury lamp (trade name: "EXM-1201" by Orc Manufacturing Co., Ltd.) and an i-ray bandpass filter were used for exposure with an irradiation energy dose for 11 steps remaining after development of the Stouffer 41-step tablet. The support film was released, and 1 wt % aqueous sodium carbonate at 30° C. was sprayed for 2 times the minimum developing time to remove the unexposed sections, for development. The resolution was evaluated based on the smallest space width between line widths (units: μm) that allowed clean removal of the unexposed sections, when observing the developed resist pattern using an optical microscope. Small values are more satisfactory in evaluating the resolution. The results are shown in Tables 5 to 7.

(Adhesiveness Measurement Test)

In order to investigate the adhesiveness, a phototool with a 41-step tablet and a glass chromium-type phototool having a wiring pattern with a line width/space width of 2/6-30/90 (units: μm) as a negative for evaluation of adhesiveness were adhered to the support film of the test strip, and an exposure device equipped with a high-pressure mercury lamp (trade name: "EXM-1201" by Orc Manufacturing Co., Ltd.) was used for exposure at an irradiation energy dose for 11.0 remaining steps after development of the 41-step tablet. The support film was released, and 1 wt % aqueous sodium carbonate at 30° C. was sprayed for 2 times the minimum developing time to remove the unexposed sections, for development. The adhesiveness was evaluated by measuring the smallest width among the line widths (units: μm) that allowed clean removal of the unexposed sections by developing treatment, and that remained without peeling or twisting when the developed resist pattern was observed using an optical microscope. Smaller values are desirable for the adhesiveness evaluation. The results are shown in Tables 5 to 7.

(Evaluation of Resist Line Cross-Sectional Shape and Resist Footing)

The substrate evaluated in the resolution measurement test described above was examined, and the cross-sectional shapes of the resist lines of the wiring pattern were observed at prescribed locations with a line width/space width of x/x (units: μm). As the observation method, a protective film was formed for the resist using tungsten, and then a focused ion beam machining analyzer (trade name: "FB-2000A" by Hitachi, Ltd., ion species: Ga ion, acceleration voltage: 30 kV, analysis conditions: ϕ500 μm beam aperture) was used for exposure of the resist cross-section at the center section of the resist pattern. This was followed by observation with a scanning electron microscope (trade name: "FE-SEM S-4700" by Hitachi, Ltd., and the difference in line width between the top side of the resist and the bottom side of the resist was measured and evaluated in the following manner. The results are shown in Tables 5 to 7.

A: Line width difference of less than 1.0 μm.
B: Line width difference of 1.0-1.5 μm.
C: Line width difference exceeding 1.5 μm.

Resist footing at the resist bottom parts was also measured and evaluated in the following manner. The results are shown in Tables 5 to 7.

A: Line width difference of less than 0.3 μm.
B: Line width difference of 0.3-0.6 μm.
C: Line width difference exceeding 0.6-0.9 μm.
D: Line width difference exceeding 0.9 μm.

(Evaluation of Resist Line Edge Form)

The resist line edge form of a substrate evaluated by the resolution measurement test described above was observed using a scanning electron microscope (trade name: SU-1500 by Hitachi, Ltd.), and evaluated in the following manner. The results are shown in Tables 5 to 7.

A: Smooth form.
B: Slightly rough form
C: Rough form (Resist Defect Formation Measurement Test)

In order to investigate the resist microdefect formation, a phototool with a 41-step tablet and a glass chromium-type phototool having a wiring pattern with a line width/space width of 10/30 (units: μm) as a negative for evaluation of adhesiveness were adhered to the support film of the test strip, and an exposure device equipped with a high-pressure mercury lamp and an i-ray bandpass filter were used for exposure with an irradiation energy dose for 8.0 remaining steps after development of the 41-step tablet. The support film was released, and 1 wt % aqueous sodium carbonate at 30° C. was sprayed for 4 times the minimum developing time to remove the unexposed sections, for development. A microscope was then used to count the number of resist defects. Using 10 lines with a line length of 1 mm as the observational unit, the mean value for n=5 was determined as the number of formed resist microdefects. The results are shown in Tables 5 to 7.

TABLE 5

| Items | | Example | | | | | | | | | |
|---|---|---|---|---|---|---|---|---|---|---|---|
| | | 1 | 2 | 3 | 4 | 5 | 6 | 7 | 8 | 9 | 10 |
| Support film | Product name | FB40 | FB40 | FB40 | FB40 | FB40 | FB40 | FB40 | FB40 | FB40 | FB40 |
| | Film thickness (μm) | 16 | 16 | 16 | 16 | 16 | 16 | 16 | 16 | 16 | 16 |
| | Particles (number/mm$^2$) | 1 | 1 | 1 | 1 | 1 | 1 | 1 | 1 | 1 | 1 |
| | Haze (%) | 0.4 | 0.4 | 0.4 | 0.4 | 0.4 | 0.4 | 0.4 | 0.4 | 0.4 | 0.4 |
| Photo-sensitive layer | Vinyl group concentration [mmol/g] | 1.165 | 1.210 | 1.164 | 0.980 | 0.921 | 1.021 | 0.961 | 1.484 | 0.958 | 1.155 |
| | Thickness (μm) | 20 | 20 | 20 | 20 | 20 | 20 | 20 | 20 | 20 | 20 |
| | Absorbance | 0.18 | 0.30 | 0.30 | 0.30 | 0.30 | 0.30 | 0.30 | 0.30 | 0.30 | 0.31 |
| | Y value | 0.009 | 0.015 | 0.015 | 0.015 | 0.015 | 0.015 | 0.015 | 0.015 | 0.015 | 0.016 |
| Minimum development time (sec) | | 15 | 17 | 15 | 14 | 12 | 12 | 12 | 16 | 13 | 15 |
| Irradiation energy (mJ/cm$^2$) | | 160 | 85 | 90 | 95 | 100 | 90 | 95 | 80 | 90 | 75 |
| Adhesion (μm) | | 5 | 5 | 5 | 6 | 7 | 6 | 7 | 4 | 6 | 5 |
| Resolution (μm) | | 6 | 5 | 5 | 6 | 7 | 5 | 5 | 6 | 6 | 5 |
| Resist cross-sectional shape | Observed location [μm] | 10 | 10 | 10 | 10 | 10 | 10 | 10 | 10 | 10 | 10 |
| | Evaluation | A | A | A | A | A | A | A | A | A | A |
| Resist side shape | | A | A | A | A | A | A | A | A | A | A |
| Number of resist defects | | 0 | 0 | 0 | 0 | 0 | 0 | 0 | 0 | 0 | 0 |

TABLE 5-continued

| | Example | | | | | | | | | |
|---|---|---|---|---|---|---|---|---|---|---|
| Items | 1 | 2 | 3 | 4 | 5 | 6 | 7 | 8 | 9 | 10 |
| Resist footing [μm] | A | A | A | A | B | B | B | A | A | A |
| Flexibility [φmm] | 8 | 10 | 8 | 6 | 4 | 8 | 6 | 20 | 6 | 10 |

TABLE 6

| | | Example | | | | | | | | | |
|---|---|---|---|---|---|---|---|---|---|---|---|
| Items | | 11 | 12 | 13 | 14 | 15 | 16 | 17 | 18 | 19 | 20 |
| Support film | Product name | FB40 | FB40 | FB40 | FB40 | FB40 | FB40 | FB40 | FB40 | FB40 | FB40 |
| | Film thickness (μm) | 16 | 16 | 16 | 16 | 16 | 16 | 16 | 16 | 16 | 16 |
| | Particles (number/mm$^2$) | 1 | 1 | 1 | 1 | 1 | 1 | 1 | 1 | 1 | 1 |
| | Haze (%) | 0.4 | 0.4 | 0.4 | 0.4 | 0.4 | 0.4 | 0.4 | 0.4 | 0.4 | 0.4 |
| Photo-sensitive layer | Vinyl group concentration [mmol/g] | 1.164 | 1.164 | 1.164 | 1.164 | 1.164 | 1.164 | 1.164 | 1.164 | 1.164 | 1.236 |
| | Thickness (μm) | 20 | 20 | 20 | 5 | 10 | 30 | 40 | 50 | 100 | 20 |
| | Absorbance | 0.31 | 0.28 | 0.38 | 0.07 | 0.14 | 0.45 | 0.60 | 0.75 | 1.50 | 0.30 |
| | Y value | 0.016 | 0.014 | 0.019 | 0.014 | 0.014 | 0.015 | 0.015 | 0.015 | 0.015 | 0.015 |
| Minimum development time (sec) | | 15 | 15 | 15 | 3 | 7 | 23 | 32 | 45 | 100 | 12 |
| Irradiation energy (mJ/cm$^2$) | | 75 | 75 | 170 | 80 | 80 | 95 | 100 | 110 | 140 | 90 |
| Adhesion (μm) | | 5 | 5 | 4 | 3 | 4 | 6 | 9 | 13 | 25 | 7 |
| Resolution (μm) | | 5 | 5 | 6 | 4 | 5 | 6 | 10 | 12 | 25 | 7 |
| Resist cross-sectional shape | Observed location [μm] | 10 | 10 | 10 | 10 | 10 | 10 | 10 | 20 | 30 | 10 |
| | Evaluation | A | A | A | A | A | A | A | A | A | A |
| Resist side shape | | A | A | A | A | A | A | A | A | A | A |
| Number of resist defects | | 0 | 0 | 0 | 0 | 0 | 0 | 0 | 0 | 0 | 0 |
| Resist footing [μm] | | A | A | A | A | A | A | A | A | A | A |
| Flexibility [φmm] | | 10 | 10 | 10 | 4 | 8 | 15 | 15 | 20 | >20 | 10 |

TABLE 7

| | | Comparative Example | | | | | | |
|---|---|---|---|---|---|---|---|---|
| Items | | 1 | 2 | 3 | 4 | 5 | 6 | 7 |
| Support film | Product name | FB40 | FB40 | FB40 | FB40 | FB40 | A-1517 | HTR-02 |
| | Film thickness (μm) | 16 | 16 | 16 | 16 | 16 | 16 | 16 |
| | Particles (number/mm$^2$) | 1 | 1 | 1 | 1 | 1 | 105 | 318 |
| | Haze (%) | 0.4 | 0.4 | 0.4 | 0.4 | 0.4 | 0.2 | 2.0 |
| Photo-sensitive layer | Vinyl group concentration [mmol/g] | 1.163 | 1.164 | 1.163 | 1.163 | 1.163 | 1.164 | 1.164 |
| | Thickness (μm) | 20 | 20 | 20 | 50 | 100 | 20 | 20 |
| | Absorbance | 0.43 | 0.53 | 0.65 | 1.63 | 3.25 | 0.30 | 0.30 |
| | Y value | 0.022 | 0.027 | 0.033 | 0.033 | 0.033 | 0.015 | 0.015 |
| Minimum development time (sec) | | 15 | 15 | 15 | 15 | 15 | 15 | 15 |
| Irradiation energy (mJ/cm$^2$) | | 60 | 130 | 100 | 120 | 160 | 90 | 90 |
| Adhesion (μm) | | 6 | 5 | 8 | 25 | >30 | 5 | 5 |
| Resolution (μm) | | 5 | 6 | 5 | 20 | >30 | 5 | 6 |
| Resist cross-sectional shape | Observed location [μm] | 10 | 10 | 10 | 20 | — | 10 | 10 |
| | Evaluation | B | B | C | C | — | A | A |
| Resist side shape | | A | A | A | A | — | B | A |
| Number of resist defects | | 0 | 0 | 0 | 0 | — | 7 | 217 |
| Resist footing [μm] | | B | B | C | D | — | A | A |
| Flexibility [φmm] | | 10 | 10 | 10 | 20 | >20 | 10 | 10 |

As shown in Tables 5 to 7, using the photosensitive element of the invention allows formation of a resist pattern with satisfactory adhesiveness and resolution, with sufficiently reduced microdefects of the resist, and with a more nearly rectangular cross-sectional shape.

INDUSTRIAL APPLICABILITY

According to the invention it is possible to provide a photosensitive element comprising a layer made of a photosensitive resin composition, the photosensitive element allowing formation of a resist pattern with satisfactory adhesiveness and resolution, with sufficiently reduced microdefects of the resist, and with a more nearly rectangular cross-sectional shape, even for substrates with a substrate surface roughness (Ra) of less than 300 nm, as well as a method for forming a resist pattern using the same.

REFERENCE SIGNS LIST

1: Photosensitive element, 10: support film, 12: first main side, 14: second main side, 20: photosensitive layer.

The invention claimed is:

1. A method for forming a resist pattern, the method comprising the steps of:
   (a) providing a combination of a photosensitive element and a circuit-forming board, the combination comprising
   a circuit-forming board with a surface roughness (Ra) of less than 300 nm;
   a support film, wherein a support film haze is 0.01-1.5% and a total number of particles with diameters of 5 μm and larger and aggregates with diameters of 5 μm or larger in the support film is no greater than 5/mm²; and
   a photosensitive layer derived from a photosensitive resin composition formed on the support film that comprises,
   a binder polymer,
   a photopolymerizable compound with an ethylenically unsaturated bond, and
   a photopolymerization initiator that contains
   a 2,4,5-triarylimidazole dimer, and
   a pyrazoline compound represented by the following general formulas (XI) or (XII),

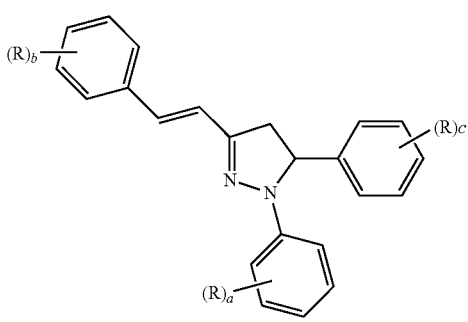

(XI)

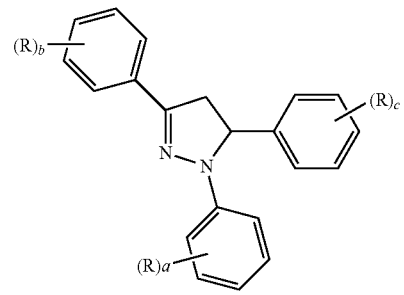

(XII)

wherein, in the formulas (XI) or (XII), R each independently represents a C1-12 straight-chain or branched alkyl group, a C1-10 straight-chain or branched alkoxy group or a halogen atom, a, b and c each independently represent an integer of 0 to 5, the total of a, b and c being between 1 and 6, and when the total of a, b and c is 2 or greater the multiple R groups may be the same or different, wherein the pyrazoline compound is 0.5 to 5.0 wt % based on a total amount of the 2,4,5-triarylimidazole dimer and the pyrazoline compound, and wherein the thickness T of the photosensitive layer and the absorbance A of the photosensitive layer at 365 nm satisfies the relationship represented by the following inequality (I):

$$0.001 \leq A/T \leq 0.020 \qquad (I)$$

(b) laminating the photosensitive element on the circuit-forming board in the order of (1) the photosensitive layer, and then (2) the support film,
wherein a surface of the circuit-forming board that is in contact with the photosensitive element has the surface roughness (Ra) of less than 300 nm;
(c) exposing prescribed sections of the photosensitive layer to irradiation with active light rays through the support film and thereby photocuring the prescribed sections on the photosensitive layer; and
(d) removing by developing the non-photocured sections of the photosensitive layer.

2. A method for producing a printed wiring board, wherein the method comprises the steps of:
   (a) providing a circuit-forming board having a resist pattern formed by the method for forming a resist pattern according to claim 1; and
   (b) etching or plating the circuit-forming board.

3. The method for forming a resist pattern according to claim 1, wherein the pyrazoline compound of the photosensitive element is 0.5 to 4.0 wt % based on the total amount of the 2,4,5-triarylimidazole dimer and the pyrazoline compound.

4. The method for forming a resist pattern according to claim 1, wherein at least one of the R groups of the photosensitive element is an isopropyl group.

5. The method for forming a resist pattern according to claim 1, wherein at least one of the R groups of the photosensitive element is a methoxy or ethoxy group.

6. The method for forming a resist pattern according to claim 1, wherein the photopolymerizable compound of the photosensitive element contains a compound represented by the following general formula (II),

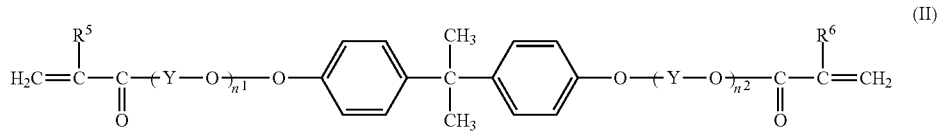

(II)

wherein, in the formula (II), $R^5$ and $R^6$ each independently represent hydrogen or a methyl group, Y represents a C2-6 alkylene group, $n^1$ and $n^2$ each independently represent a positive integer, $n^1+n^2$ is 2-40, and when $n^1+n^2$ is 2 or greater the multiple Y groups may be the same or different.

7. The method for forming a resist pattern according to claim 1, wherein the binder polymer of the photosensitive element has a divalent group represented by the following general formulas (III), (IV) and (V),

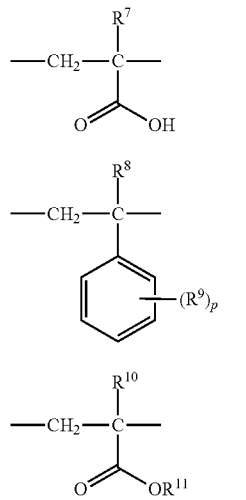

wherein, in the formulas (III), (IV) and (V), $R^7$, $R^8$ and $R^{10}$ each independently represent hydrogen or a methyl group, $R^9$ represents a C1-4 alkyl group, a C1-3 alkoxy group, a hydroxyl group or a halogen atom, $R^{11}$ represents a C1-6 alkyl group, p represents an integer of 0-5, and when p is 2 or greater the multiple $R^9$ groups may be the same or different.

8. The method for forming a resist pattern according to claim 7, wherein the binder polymer also has a divalent group represented by the following formula (VI),

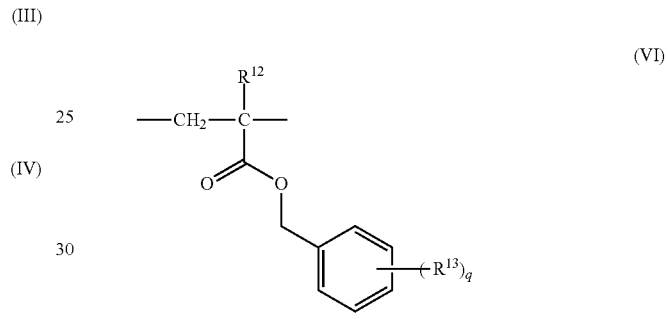

wherein, in the formula (VI), $R^{12}$ represents hydrogen or a methyl group, $R^{13}$ represents a C1-4 alkyl group, a C1-3 alkoxy group, a hydroxyl group or a halogen atom, q represents an integer of 0-5, and when q is 2 or greater, the multiple $R^{13}$ groups may be the same or different.

* * * * *